United States Patent
Van Der Laan et al.

(10) Patent No.: US 10,578,982 B2
(45) Date of Patent: Mar. 3, 2020

(54) SUBSTRATE MEASUREMENT RECIPE DESIGN OF, OR FOR, A TARGET INCLUDING A LATENT IMAGE

(71) Applicant: ASML NETHERLANDS B.V., Veldhoven (NL)

(72) Inventors: Hans Van Der Laan, Veldhoven (NL); Mir Homayoun Shahrjerdy, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/323,849

(22) PCT Filed: Jul. 21, 2017

(86) PCT No.: PCT/EP2017/068465
§ 371 (c)(1),
(2) Date: Feb. 7, 2019

(87) PCT Pub. No.: WO2018/033342
PCT Pub. Date: Feb. 22, 2018

(65) Prior Publication Data
US 2019/0171116 A1 Jun. 6, 2019

Related U.S. Application Data

(60) Provisional application No. 62/376,269, filed on Aug. 17, 2016.

(51) Int. Cl.
*G03B 27/52* (2006.01)
*G03F 7/20* (2006.01)

(52) U.S. Cl.
CPC .......... *G03F 7/70675* (2013.01); *G03F 7/705* (2013.01); *G03F 7/70625* (2013.01)

(58) Field of Classification Search
CPC ... G03F 7/705; G03F 7/70625; G03F 7/70675
See application file for complete search history.

(56) References Cited

U.S. PATENT DOCUMENTS

| 6,046,792 A | 4/2000 | Van Der Werf et al. |
| 6,961,116 B2 | 11/2005 | Den Boef et al. |

(Continued)

FOREIGN PATENT DOCUMENTS

| WO | 2009078708 | 6/2009 |
| WO | 2009106279 | 9/2009 |
| WO | 2016086056 | 6/2016 |

OTHER PUBLICATIONS

International Search Report and Written Opinion issued in corresponding PCT Patent application No. PCT/EP2017/068465, dated Oct. 13, 2017.

(Continued)

*Primary Examiner* — Peter B Kim
(74) *Attorney, Agent, or Firm* — Pillsbury Winthrop Shaw Pittman LLP

(57) ABSTRACT

A method including computing, in accordance with one or more parameters of a substrate measurement recipe, measurement with a latent image of a target and measurement with a post-development image corresponding to the latent image, to evaluate a characteristic determined from the computed measurement with the latent image of the target and determined from the computed measurement with the post-development image corresponding to the latent image; and adjusting the one or more parameters of the substrate measurement recipe and re-performing the computing, until a certain termination condition is satisfied with respect to the characteristic.

20 Claims, 19 Drawing Sheets

(56) References Cited

U.S. PATENT DOCUMENTS

| | | |
|---|---|---|
| 2006/0066855 A1 | 3/2006 | Den Boef et al. |
| 2009/0157630 A1 | 6/2009 | Yuan |
| 2011/0027704 A1 | 2/2011 | Cramer et al. |
| 2011/0043791 A1 | 2/2011 | Smilde et al. |
| 2012/0013881 A1 | 1/2012 | Den Boef et al. |
| 2012/0242970 A1 | 9/2012 | Smilde et al. |

OTHER PUBLICATIONS

Hwang, Chan, et al.: "Investigation on Accuracy of Process Overlay Measurement", Proceedings of SPIE, vol. 7971, May 7, 2011.

SUBSTRATE MEASUREMENT RECIPE DESIGN OF, OR FOR, A TARGET INCLUDING A LATENT IMAGE

CROSS-REFERENCE TO RELATED APPLICATIONS

This application is the U.S. national phase entry of PCT patent application no. PCT/EP2017/068465, which was filed on Jul. 21, 2017, which claims the benefit of priority of U.S. provisional patent application No. 62/376,269, which was filed on Aug. 17, 2016, and which is incorporated herein in its entirety by reference.

FIELD

The description herein relates to metrology on a substrate of a device fabrication process, in particular to metrology targets suitable for measuring based on a latent image.

BACKGROUND

A lithography apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithography apparatus, one target portion at a time. In one type of lithography apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithography apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

In order to monitor one or more steps of the device fabrication process the patterned substrate is inspected and one or more characteristics related to the patterned substrate are measured. The one or more characteristics may include, for example, the overlay error between successive layers formed in or on the patterned substrate, and/or critical dimension (e.g., linewidth) of a feature on the substrate, and/or a focus used to expose a feature on the patterned substrate, and/or a dose used to expose a feature on the patterned substrate, and/or an alignment of the patterned substrate relative to another object, etc. This measurement may be performed on a target of the product portion of the substrate itself and/or on a dedicated metrology target provided on the substrate. There are various techniques for making measurements of the microscopic structures formed in lithography processes, including the use of a scanning electron microscope and/or various specialized tools.

A fast and non-invasive form of specialized inspection tool is a scatterometer in which a beam of radiation is directed onto a target on a substrate and properties of the scattered and/or reflected (or more generally redirected) beam are measured. By comparing one or more properties of the beam before and after it has been redirected from the substrate, one or more properties of the substrate (e.g., of one or more of its layers and one or more structure formed in the one or more layers) can be determined. Two main types of scatterometer are known. A spectroscopic scatterometer directs a broadband radiation beam onto the substrate and measures the spectrum (intensity as a function of wavelength) of the radiation redirected into a particular narrow angular range. An angularly resolved scatterometer uses a monochromatic radiation beam and measures the intensity of the redirected radiation as a function of angle.

A particular application of scatterometry is in the measurement of feature asymmetry within a periodic target. This can be used as a measure of overlay error, for example, but other applications are also known. In an angle resolved scatterometer, asymmetry can be measured by comparing opposite parts of the diffraction spectrum (for example, comparing the −1st and +1st orders in the diffraction spectrum of a periodic grating). This can be done simply in angle-resolved scatterometry, as is described for example in U.S. patent application publication US 2006-066855, which is incorporated herein its entirety by reference.

SUMMARY

In an embodiment, there is provided a method comprising: computing, by a hardware computer system in accordance with one or more parameters of a substrate measurement recipe, measurement with a latent image of a target and measurement with a post-development image corresponding to the latent image, to evaluate a characteristic determined from the measurement with the latent image of the target and determined from the measurement with the post-development image corresponding to the latent image; and adjusting the one or more parameters of the substrate measurement recipe and re-performing the computing, until a certain termination condition is satisfied with respect to the characteristic.

Also disclosed herein is a computer program product comprising a computer non-transitory readable medium having instructions recorded thereon, the instructions when executed by a computer implementing any of the methods above.

DETAILED DESCRIPTION

Figure 1:
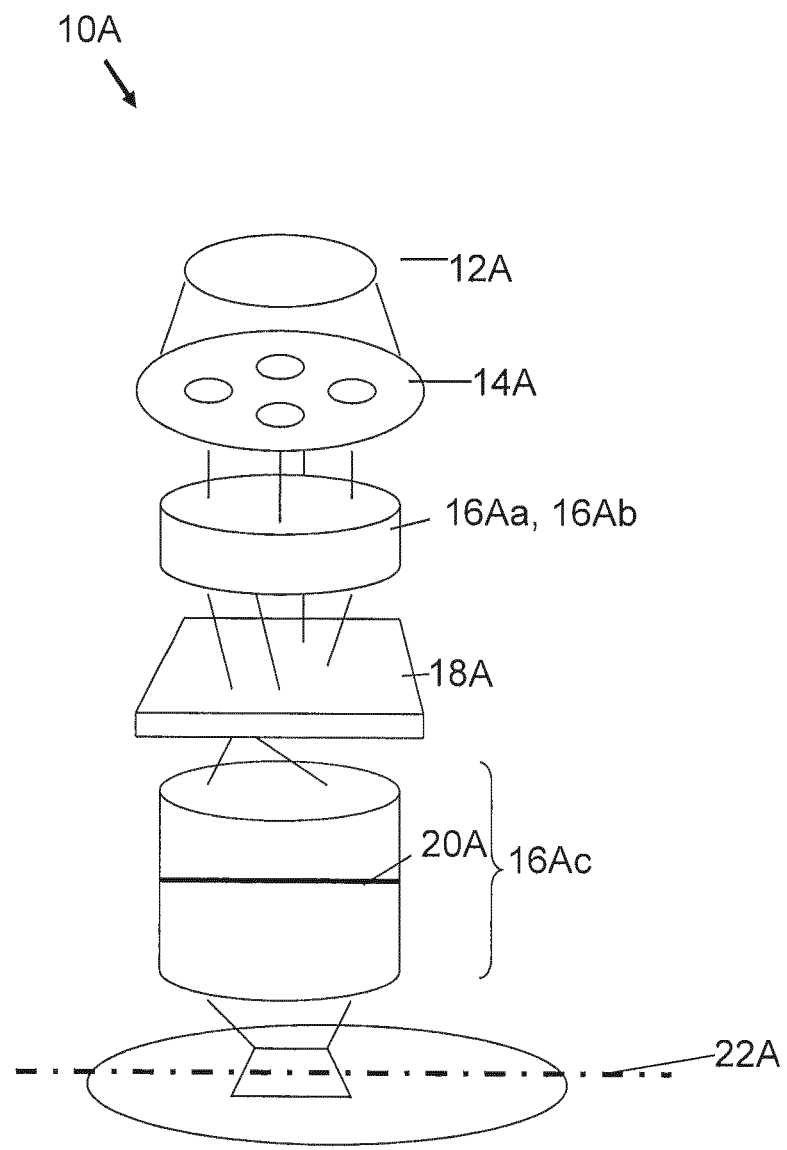
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "optimizing" and "optimization" as used herein refers to or means adjusting the patterning process or an apparatus of the patterning process, which may include adjusting a lithography process or apparatus, or adjusting a metrology process or apparatus, such that a figure of merit has a more desirable value, such as projection of a design layout on a substrate being more accurate, a process window being larger, etc. Thus, the term "optimizing" and "optimization" as used herein refers to or means a process that identifies one or more values for one or more design variables that provide an improvement, e.g. a local optimum, in a figure of merit, compared to an initial set of values of the design variables. "Optimum" and other related terms should be construed accordingly. In an embodiment, optimization steps can be applied iteratively to provide further improvements in one or more figures of merit.

In an embodiment involving an optimization process of a system or process, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics of the system or process with respect to the intended values (e.g., ideal values) of these characteristics; the cost function can also be the maximum of these deviations (i.e., worst deviation). The design variables can be confined to finite ranges and/or be interdependent due to practicalities of implementations of the system or process. In the case of a lithography apparatus or process or a metrology apparatus or process, the constraints are often associated with physical properties and characteristics of the hardware or materials, such as tunable ranges, patterning device manufacturability design rules, etc.

As a brief introduction, FIG. 1 illustrates an exemplary lithography apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithography apparatus itself need not have the radiation source); and optics 16Ac that project an image of a patterning device pattern of a patterning device 18A onto a substrate plane 22A. An adjustable filter or aperture 20A at the pupil plane of the projection system may restrict the range of beam angles that impinge on the substrate plane 22A, where the largest possible angle defines the numerical aperture of the projection system $NA=\sin(\Theta_{max})$.

In a lithography apparatus, the projection system directs and shapes the illumination from a source via a patterning device and onto a substrate. The term "projection system" is broadly defined here to include any optical component that may alter the wavefront of the radiation beam. An aerial image (AI) is the radiation intensity distribution at substrate level. A resist layer on the substrate is exposed and the aerial image is transferred to the resist layer as a latent "resist image" (RI) therein. The latent resist image can be enhanced by a post exposure bake. The latent resist image (RI) (or simply "latent image") can be defined as a spatial distribution of a characteristic (e.g., thickness, refractive index, extinction coefficient, etc., or a combination selected therefrom) of the resist in the resist layer, before the resist layer is developed. A developed image of the latent image is a spatial distribution of the resist in the resist layer after the resist layer having the latent image has been developed.

A resist model can be used to calculate the resist image (latent or developed) from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithography apparatus (e.g., properties of the illumination, the patterning device and the projection system) dictate the aerial image. Since the patterning device used in the lithography apparatus can be changed, it is desirable to separate the optical properties of the patterning device from the optical properties of the rest of the lithography apparatus including at least the illumination system and the projection system.

Figure 2:
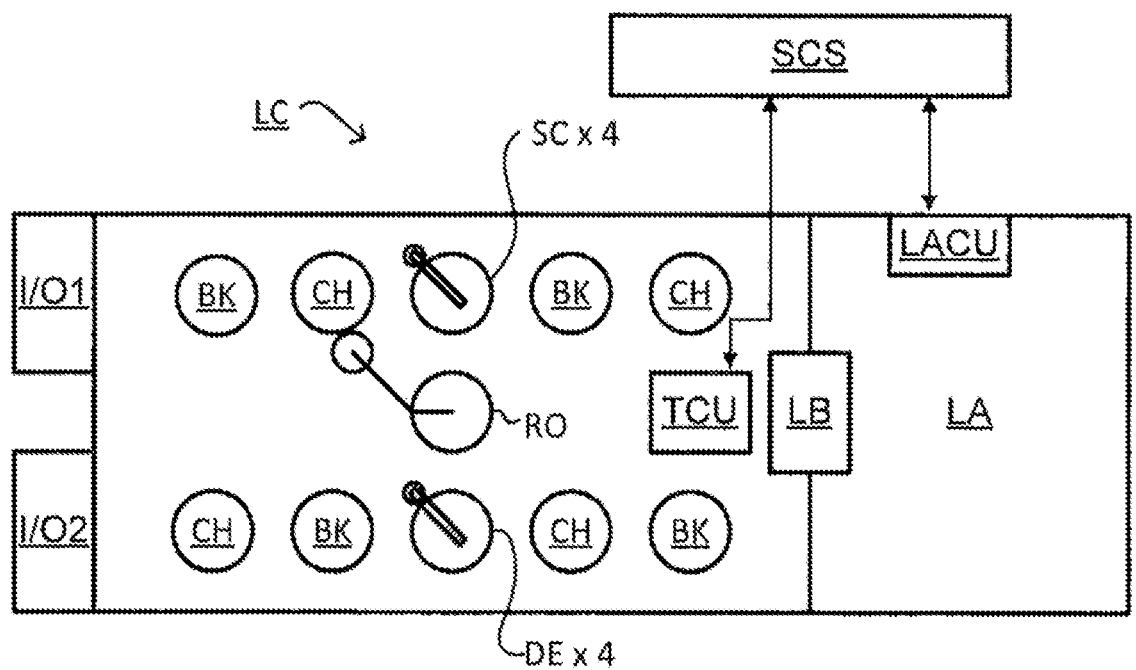
FIG. 2 schematically depicts an embodiment of a lithographic cell or cluster.

As shown in FIG. 2, the lithography apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithography apparatus. These devices, which are often collectively referred to as the track, are under the control of a track control unit TCU which is itself controlled by the supervisory control system SCS, which also controls the lithography apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc.

In a device fabrication process (e.g., a patterning process or a lithography process), a substrate may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of substrate measurement include optical imaging (e.g., optical microscope), non-imaging optical measurement (e.g., measurement based on diffraction such as ASML YieldStar, ASML SMASH GridAlign), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

To enable measurement, a substrate measurement recipe can be used that specifies one or more parameters of the measurement using the measurement system. In an embodiment, the term "substrate measurement recipe" includes one or more parameters of the measurement itself, one or more parameters of a pattern measured, or both. For example, if the measurement used in a substrate measurement recipe is a diffraction-based optical measurement, one or more parameters of the measurement itself may include a wavelength of measurement radiation, a polarization of measurement radiation, an incident angle relative to the substrate of measurement radiation, and/or the relative orientation relative to a pattern on the substrate of diffracted measurement radiation. The one or more parameters of the measurement itself may include one or more parameters of the metrology apparatus used in the measurement. A pattern measured may be a pattern whose diffraction is measured. The pattern measured may be a pattern specially designed or selected for measurement purposes (also known as a "target" or "target structure"). Multiple copies of a target may be placed on many places on a substrate. A substrate measurement recipe may be used to align a layer of a pattern being imaged against an existing pattern on a substrate. A substrate measurement recipe may be used to align the patterning device to the substrate, by measuring a relative position of the substrate. If the substrate measurement recipe comprises one or more parameters of a pattern measured, the one or more parameters of the pattern measured may include an identification of the pattern (e.g., distinguishing a pattern being from another pattern), and/or a shape at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a materials property (e.g., refractive index, extinction coefficient, material type, etc.) of at least part of the pattern, and/or a segmentation of a feature of the pattern (e.g., a division of a feature of a periodic structure into sub-structures), etc.

A substrate measurement recipe may be expressed in a form like $(r_1, r_2, r_3, \ldots r_n; t_1, t_2, t_3, \ldots t_m)$, where $r_i$ are one or more parameters of the measurement and $t_j$ are one or more parameters of one or more patterns measured. As will be appreciated, n and m can be 1. Further, the substrate measurement recipe does not need to have both one or more parameters of the measurement and one or more parameters of one or more patterns measured; it can have just one or more parameters of the measurement or have just one or more parameters of one or more patterns measured.

Figure 4:
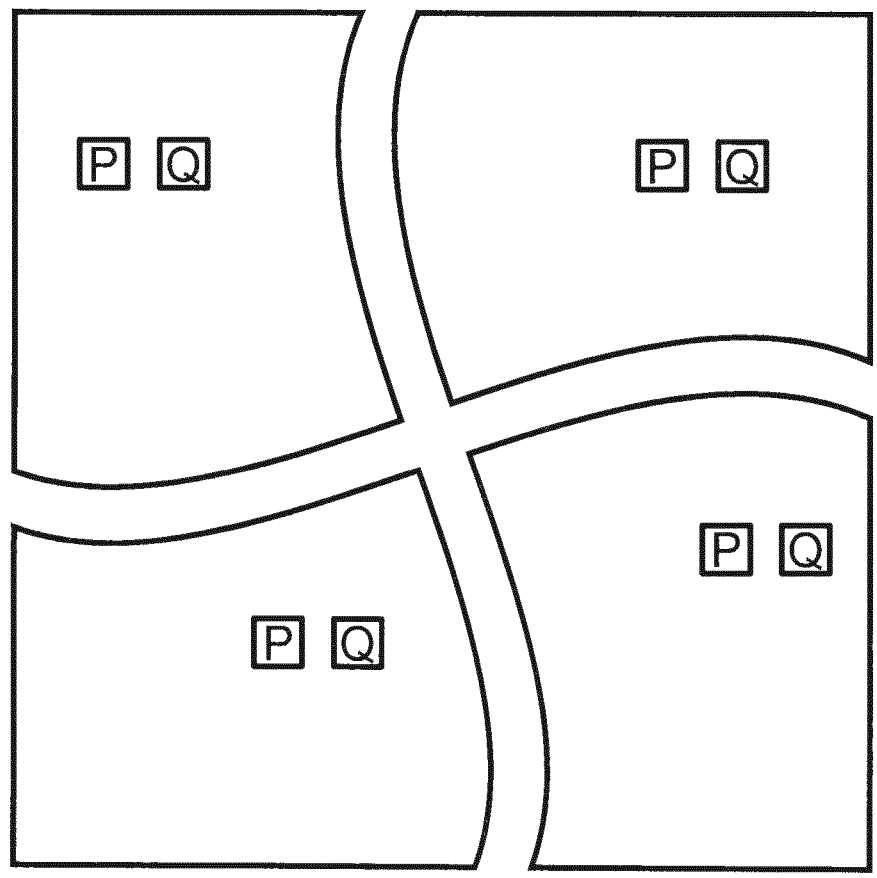
FIG. 4 schematically shows a substrate with two distinct targets P and Q, where copies of each are placed in four different areas of the substrate.

FIG. 4 schematically shows a substrate with two distinct targets P and Q, where copies of each are placed in four different areas of the substrate. The targets may include gratings, e.g., of mutually perpendicular directions. The target may include locations on a pattern where a measurement can detect displacement of an edge of the pattern or a dimension of the pattern. In an embodiment, the target may comprise a first structure in a lower layer and a second structure in a higher layer, for example, for overlay determination. The substrate of FIG. 4 may be subjected to measurement using two substrate measurement recipes A and B. Substrate measurement recipes A and B can at least differ on the target measured (e.g., A measures target P and B measures target Q) and/or differ on the stage at which target P and/or target Q is measured (e.g., A measures target P and/or Q when it comprises a latent image structure and B measures target P and/or Q when it doesn't comprise a latent image structure). Substrate measurement recipes A and B may differ on the parameters of their measurement. Substrate measurement recipes A and B may not even be based on the same measurement technique. For example recipe A may be based on SEM measurement and recipe B may be based on AFM measurement.

A target used by a scatterometer may comprise a relatively large periodic structure layout (e.g., comprising one or more gratings), e.g., 40 µm by 40 µm. In that case, the measurement beam often has a spot size that is smaller than the periodic structure layout (i.e., the layout is underfilled such that one or more of the periodic structures is not completely covered by the spot). This can help, for example, simplify mathematical reconstruction of the target as it can be regarded as infinite. However, for example, when the target can be positioned in among product features, rather than in a scribe lane, the size of a target may be reduced, e.g., to 20 µm by 20 µm or less, or to 10 µm by 10 µm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011/0027704, US2011/0043791 and US2012/0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

The target on a substrate may comprise one or more 1-D periodic gratings, which are printed such that after development, the bars are formed of solid resist lines. The target may comprise one or more 2-D periodic gratings, which are printed such that after development, the one or more gratings are formed of solid resist pillars or vias in the resist. The bars, pillars or vias may alternatively be etched into the substrate.

In an embodiment, the pattern of the grating is sensitive to an imaging variable (e.g., chromatic aberration, focus, dose, etc.) in the lithographic projection apparatus and the presence of such an imaging variable will manifest itself in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes. Thus, an imaging variable (such as focus and dose) can be determined.

Figure 3A:
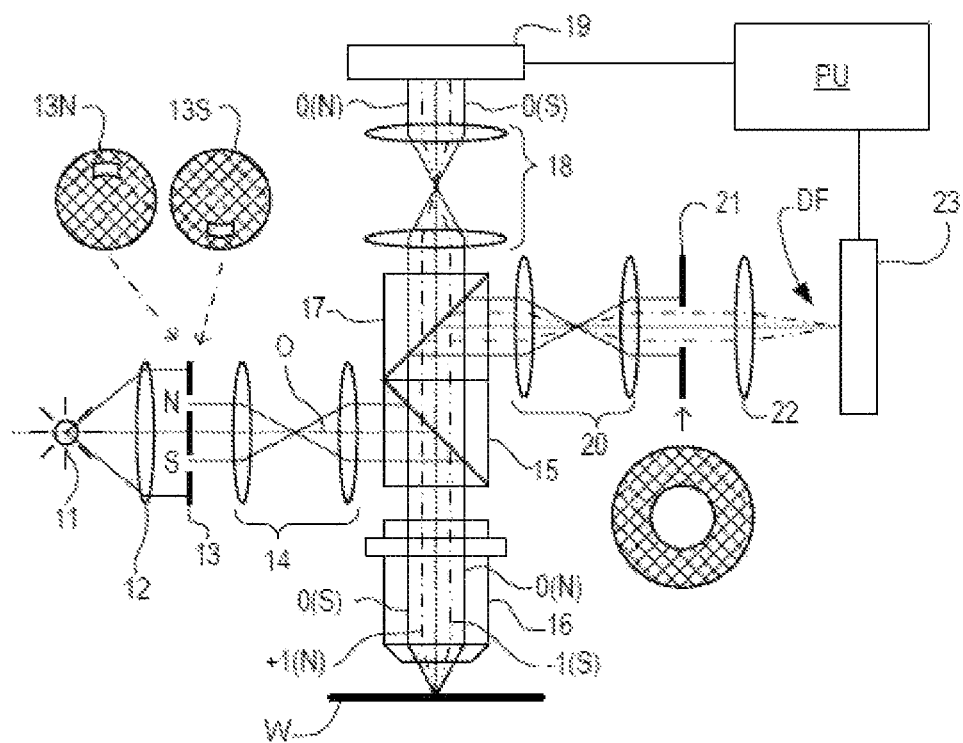
FIG. 3A is a schematic diagram of an example measurement apparatus for use in measuring targets according to an embodiment using a first pair of illumination apertures providing certain illumination modes.

A dark field metrology apparatus is shown in FIG. 3A. A target T (comprising a periodic structure such as a grating) and diffracted rays are illustrated in more detail in FIG. 3B. The dark field metrology apparatus may be a stand-alone device or incorporated in either the lithography apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. The radiation may be ultraviolet radiation or X-ray. These lenses are arranged in a double sequence of a 4F arrangement. A different lens arrangement can be used, provided that it still provides a substrate image onto a detector.

The lens arrangement may allow for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. The rest of the pupil plane is desirably dark as any unnecessary radiation outside the desired illumination mode may interfere with the desired measurement signals. The parameters of the measurement using a substrate measurement recipe may include the intensity distribution at the pupil plane. A target may be a part of multiple substrate measurement recipes that differ in the intensity distribution at the pupil plane. Other modes of illumination are possible by using different apertures. For example, one or more of the apertures may form an annular or ring illumination zone with either a "dark" region interior and/or exterior of the annular or ring illumination zone. One or more of the apertures may form a conventional illumination with an illumination zone at the center in, for example, a circle/round disk shape. One or more of the apertures may have a plane segmented into equal parts around a center of the plane (e.g., quadrants) of which less than all of the segments provide illumination. For example, the aperture may be divided into quadrants in which diagonally opposing quadrants provide illumination. In an embodiment, the boundary of the plane is circular and so the segments are essentially shaped like pie slices. In an embodiment, the segments need not reach out to the boundary of the plane and thus there may be a "dark" ring around the segments. The aperture usage can be dependent on the target type and inspection apparatus configuration. For example, for a target like in FIGS. 3E, 3L and/or 3M described hereafter, the annular/ring and/or conventional aperture can be useful depending on the pitch of the features of the metrology target. For example, for a target like in FIGS. 3G, 3J and/or 3K described hereafter, the segmented aperture can be useful depending on the pitch of the features of the metrology target.

Figure 3B:
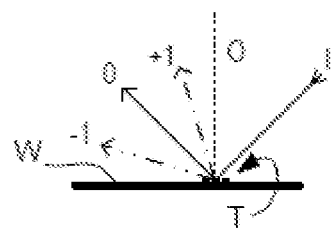
FIG. 3B is a schematic detail of a diffraction spectrum of a target for a given direction of illumination.

As shown in FIG. 3A, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIG. 3A and FIG. 3B are shown somewhat off axis, purely to enable them to be more easily distinguished in the diagram.

At least the 0 and +1 orders diffracted by the target on substrate W are collected by objective lens 16 and directed back through prism 15. Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1$^{st}$ and the +1$^{st}$ diffraction order intensities. Comparing these intensities for a given target provides a measurement of asymmetry in the target, and asymmetry in the target can be used as an indicator of a characteristic of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

Figure 3C:
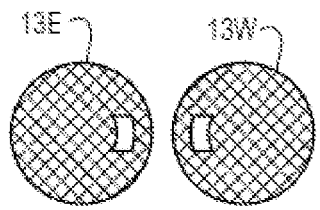
FIG. 3C is a schematic illustration of a second pair of illumination apertures providing further illumination modes in using a measurement apparatus for diffraction based overlay measurements.
Figure 3D:
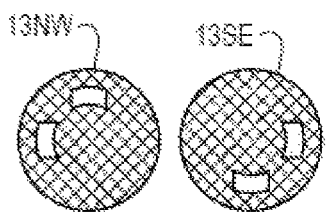
FIG. 3D is a schematic illustration of a third pair of illumination apertures combining the first and second pairs of apertures providing further illumination modes in using a measurement apparatus for diffraction based overlay measurements.

The particular forms of aperture plate 13 and stop 21 shown in FIG. 3C and FIG. 3D are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIG. 3C and FIG. 3D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3D, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 3E:
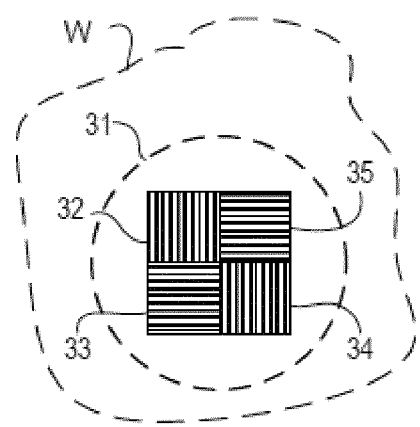
FIG. 3E depicts a form of multiple periodic structure (e.g., multiple grating) target and an outline of a measurement spot on a substrate.

FIG. 3E depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Figure 3F:
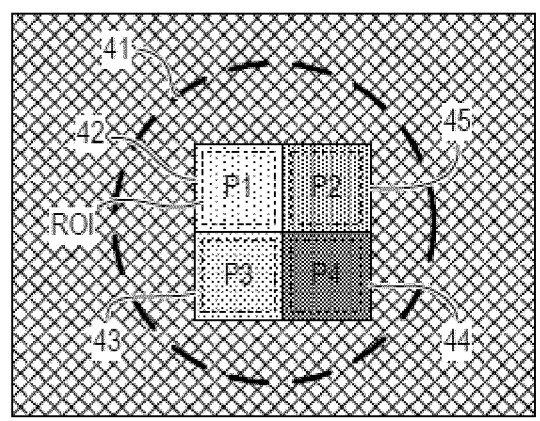
FIG. 3F depicts an image of the target of FIG. 3E obtained in the apparatus of FIG. 3A.

FIG. 3F shows an example of an image that may be formed on and detected by the sensor 23, using the target of FIG. 3E in the apparatus of FIG. 3A, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Figure 3G:
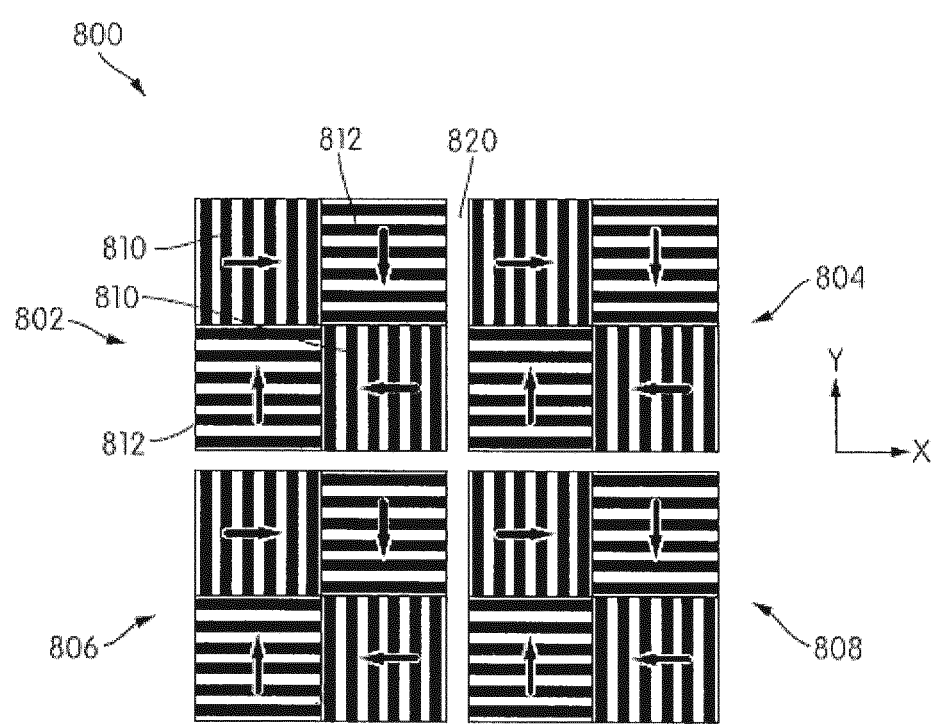
FIG. 3G illustrates an extended operating range metrology target according to an embodiment.

Referring to FIG. 3G, a further embodiment of a metrology target is depicted, which is referred to herein to as an extended operating range metrology target 800. The extended operating range metrology target 800 comprises a plurality of sub-targets, in this example, four diffraction sub-targets 802, 804, 806, 808. As will be appreciated, a different number of sub-targets may be provided. For example, just two sub-targets may be provided. Alternatively, three, five, six, seven, eight, etc. sub-targets may be provided. In an embodiment, each sub-target 802-808 is separated from a neighboring sub-target by a gap 820. In an embodiment, the gap is 200 nm or more, 250 nm or more, 350 nm or more, 500 nm or more, 750 nm or more, or 1 µm or more. The gap facilitates reconstruction of the sub-targets so that they can be separately identified. Further, the gap may help prevent cross-talk of diffraction from one sub-target extending over to another sub-target. In an embodiment, no gap is needed.

Each sub-target comprises a periodic structure. In an embodiment, each sub-target comprises at least a pair of periodic structures. In an embodiment, each sub-target comprises at least two pairs of periodic structures. In an embodiment, the features (e.g., lines) of the periodic structures in a sub-target extend in a same direction. In an embodiment, at least one periodic structure of a sub-target may have features extending in a different direction (e.g., substantially perpendicular) to the direction in which the features of another periodic structure of the sub-target extend. In an embodiment, the direction(s) in which features of periodic structures of one sub-target extend may be different from that of another sub-target.

In an embodiment, as shown in FIG. 3G, each sub-target has a first pair of periodic structures 810 having features extending in a first direction (e.g., X-direction) and a second pair of periodic structures 812 having features extending in a second different direction (e.g., a second direction substantially perpendicular to the first direction such as the Y-direction). One or more of the sub-targets need not have the second pair of periodic structures extend in a different direction or the second different direction may be non-perpendicular and non-parallel to the first direction for one or more of the sub-targets. In this example, each sub-target 802-808 has a similar overall layout as the target of FIG. 3E. That is, each sub-target has a first pair of periodic structures with features extending in the X-direction in opposite corners and a second pair of periodic structures with features extending in the Y-direction in opposite corners to the first pair of periodic structures. However, the layout of the sub-targets may be different than as depicted in FIG. 3G. For example, the locations of the periodic structures may be different. As another example, the length and/or width of one pair of periodic structures may be different than the length and/or width of another pair of periodic structures. The relative angles in which one pair of periodic structures extends to another pair of periodic structures may be different. Examples of different layouts for sub-targets are described with respect to FIGS. 3J and 3K.

The sub-targets 802-808 have a size such that they can fully or at least partly fit within the same contiguous area as the target of FIG. 3E. For example, the extended operating range metrology target 800 may have outer dimensions within or equal to 25 µm×25 µm, within or equal to 20 µm×20 µm, within or equal to 16 µm×16 µm, within or equal to 12 µm×12 µm, within or equal to 10 µm×10 µm, or within or equal to 8 m×8 µm. In an embodiment, at least part of each of sub-target is within a contiguous area of a certain size on the substrate. In an embodiment, at least part of each periodic structure of the plurality of sub-targets is within the contiguous area of the certain size on the substrate. In an embodiment, each periodic structure of the plurality of sub-targets is within the contiguous area of the certain size on the substrate. In an embodiment, the certain size is less than or equal to 1000 µm$^2$, less than or equal to 900 µm$^2$, less than or equal to 800 µm$^2$, less than or equal to 700 µm$^2$, less than or equal to 600 µm$^2$, less than or equal to 500 µm$^2$, less than or equal to 450 µm$^2$, less than or equal to 400 µm$^2$, less than or equal to 350 µm$^2$, less than or equal to 300 µm$^2$, less than or equal to 250 µm$^2$, less than or equal to 200 µm$^2$, less than or equal to 150 µm$^2$, or less than or equal to 100 µm$^2$. In an embodiment, each of the periodic structures of the sub-targets 802-808 is no smaller than about 3 µm×3 µm or no smaller than about 4 µm×4 µm. In an embodiment, each of the periodic structures of the sub-targets 802-808 is no smaller than about 9 µm$^2$ or no smaller than about 16 µm$^2$.

In an embodiment, at least part of each of sub-target is within the area of the measurement spot (e.g., within the width of the measurement spot) on the substrate. In an embodiment, at least part of each periodic structure of the plurality of sub-targets is within the area of the measurement spot (e.g., within the width of the measurement spot) on the substrate. In an embodiment, each periodic structure of the plurality of sub-targets is within the area of the measurement spot (e.g., within the width of the measurement spot) on the substrate. In an embodiment, the measurement spot has a width (e.g., diameter) of about 35 µm or less, of about 30 µm or less, of about 25 µm or less, or of about 20 µm or less, of about 15 µm or less, or of about 10 µm or less. So, in an embodiment, multiple sub-targets can be measured in one measurement sequence and in an embodiment, the diffraction data of multiple sub-targets can be detected simultaneously.

In an embodiment, a plurality of the sub-targets at least partly overlay another periodic structure (which other periodic structure is not shown in FIG. 3G merely for clarity). In an embodiment, each of the sub-targets 802-806 at least partly overlays a respective periodic structure. In an embodiment, a first extended operating range metrology target 800 overlays a second extended operating range metrology target 800. In that case, each of the plurality of the sub-targets 802-806 of the first extended operating range metrology target 800 would overlay respective sub-targets 802-806 of the second extended operating range metrology target 800. In an embodiment, the first extended operating range metrology target 800 may be in one layer and the second extended operating range metrology target 800 may be in one other layer. In an embodiment, the first extended operating range metrology target 800 may be in one layer and the second extended operating range metrology target 800 may have each of a plurality of sub-targets in different layers.

Further, besides multiple sub-targets being created within a single layout, each of a plurality of the sub-targets is designed for (a) a different process condition, and/or (b) a different layer-pair for multi-layer overlay. In other words, in an embodiment, a first sub-target 802 of the plurality of sub-targets has a different design than a second sub-target 804 of the plurality of sub-targets. In an embodiment, each of the sub-targets 802-808 may have a different design. In an embodiment, two or more sub-targets 802, 808 of the plurality of sub-targets may have a different design than two or more other sub-targets 804, 806 of the plurality of sub-targets.

Figure 3H:
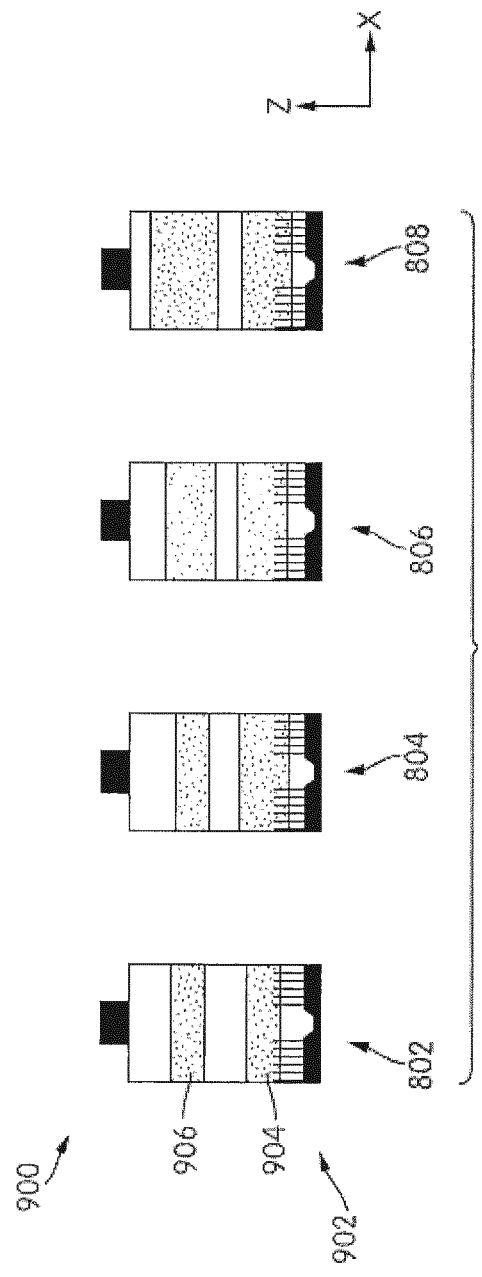
FIG. 3H illustrates use of an extended operating range metrology target according to an embodiment to account for process stack variation.

Referring to FIG. 3H, the use of an example of an extended operating range metrology target 900, 902 (of the design of FIG. 3G) having a plurality of sub-targets designed for different process conditions is depicted. For ease of reference, the sub-targets 802, 804, 806, 808 are depicted in a row in FIG. 3H. As will be appreciated from the layout of FIG. 3G, the sub-targets 806, 808 in FIG. 3H would in practice be located in "front" or "behind" the sub-targets 802, 804 in FIG. 3H, i.e., in or out of the page respectively. Further, in this embodiment, the first extended operating range metrology target 900 is at one layer and the second extended operating range metrology target 902 is at one other layer. That is, in FIG. 3H, each of the sub-targets 802, 804, 806, 808 of the first extended operating range metrology target 900 is at a top layer and each of the sub-targets 802, 804, 806, 808 of the second extended operating range metrology target 902 is in a single layer underneath the first extended operating range metrology target 900, such that each of the sub-targets 802, 804, 806, 808 of the first extended operating range metrology target 900 at least partly overlays a respective sub-target 802, 804, 806, 808 of the second extended operating range metrology target 902.

In the example of FIG. 3H, each of the sub-targets 802, 804, 806, 808 is designed for a different process stack. In this example, sub-target 802 is designed for a process stack having a first layer 904 of 100 nm and a second layer 906 of 100 nm, sub-target 804 is designed for a different process stack having a first layer 904 of 100 nm and a second layer 906 of 110 nm, sub-target 806 is designed for a different process stack having a first layer 904 of 110 nm and a second layer 906 of 110 nm, and sub-target 808 is designed for a process stack having a first layer 904 of 120 nm and a second layer 906 of 110 nm. As will be appreciated, the conditions of the different process stacks may be different than those used in this example. For example, the process conditions can be other than layer thicknesses. Other process conditions may include refractive index, layer material, etch rate, bake temperature, exposure focus, exposure dose, etc. Further, while in this embodiment, the extended operating range metrology target 900 is differently designed than the associated extended operating range metrology target 902 which it overlays (e.g., in FIG. 3H, periodic structure features in the extended operating range metrology target 902 are segmented, while periodic features in the extended operating range metrology target 900 are not), the extended operating range metrology target 900 and the extended operating range metrology target 902 may be the same. Further, while 4 different process stacks are capable of being successfully measured in FIG. 3H, there may be a different number of process stacks that could be capable of being successfully measured.

In terms of difference in design, the difference is, in an embodiment, a difference in pitch of the periodic structures between at least one of the sub-targets 802, 804, 806, 808 and another of the sub-targets 802, 804, 806, 808. In an embodiment, the pitch is selected from the range of 100 nm to 1000 nm. In an embodiment, the difference in design is a difference in feature (e.g., line) or space width of the periodic structures between at least one of the sub-targets 802, 804, 806, 808 and another of the sub-targets 802, 804, 806, 808. In an embodiment, the difference in design is a difference in segmentation of features of the periodic structures (e.g., a broken line, rather than a solid line) between at least one of the sub-targets 802, 804, 806, 808 and another of the sub-targets 802, 804, 806, 808. In an embodiment, the difference in design is a difference in bias (e.g., amount and/or direction) of the periodic structures between at least one of the sub-targets 802, 804, 806, 808 and another of the sub-targets 802, 804, 806, 808. In an embodiment, the bias is selected in the range of 1 nm to 60 nm. The arrows depict an embodiment of the direction of bias. To be sure a bias is not required or need not be in the directions shown. In an embodiment, the difference in design is a difference in feature or space width between overlying extended operating range metrology targets (e.g., a difference in "top and bottom CD"), e.g., a feature or space width of at least one of the sub-targets 802, 804, 806, 808 of a first extended operating range metrology target is different than the feature or space width of associated at least one of the sub-targets 802, 804, 806, 808 of an overlying second extended operating range metrology target. In an embodiment, the difference in design is a difference in layout of the sub-targets 802, 804, 806, 808 and their associated periodic structures. See, e.g., FIGS. 3J and 3K described hereafter. In an embodiment, the difference in design is a difference in optimum wavelength for the measuring beam between at least one of the sub-targets 802, 804, 806, 808 and another of the sub-targets 802, 804, 806, 808. Where the same wavelength measurement recipe is used for each of the sub-targets 802, 804, 806, 808, the sub-targets 802, 804, 806, 808 may be optimized to accept a minimal performance loss on each sub-target. Or, in an embodiment, multiple wavelengths may be used for the plurality of sub-targets or wavelengths may be separated out of broadband radiation applied to the sub-targets. As will be appreciated, a combination of design parameters may be used.

So, in an embodiment, the extended operating range metrology targets 900, 902 may be provided, in a first example, to a process stack that has the characteristics of sub-target 802, namely a process stack having a first layer 904 of 100 nm and a second layer 906 of 100 nm. Accordingly, when the measurements of those extended operating range metrology targets 900, 902 are made, the measurement results from sub-target 802 will be good for that process stack while the measurement results from sub-targets 804, 806, and 808 will be less so. But, conveniently, the same extended operating range metrology targets 900, 902 may be provided, in a second example, to a process stack that has the characteristics of sub-target 804, namely a process stack having a first layer 904 of 100 nm and a second layer 906 of 110 nm. Accordingly, when the measurements of those extended operating range metrology targets 900, 902 are made in this different process stack, the measurement results from sub-target 804 in this case will be good for that process stack while the measurement results from sub-targets 802, 806, and 808 will be less so.

To determine whether the measurement results are good, one or more different techniques may be used. For example, in the first example mentioned above, there may simply not be any or significantly weaker measurement results from sub-targets 804, 806, and 808 because they are effectively unmeasurable. In another example, a residual (e.g., an overlay residual) can be measured for each of the sub-targets and a lower or lowest residual for one of the sub-targets may signify that the measurement results from the sub-target are good. In another example, the same parameter (e.g., overlay) may be measured by another process. As an example, an electrical test may be performed to determine a value for the parameter and the sub-target with the nearest value to that measured by the electrical test may signify that the measurement results from the sub-target are good.

Figure 3I:
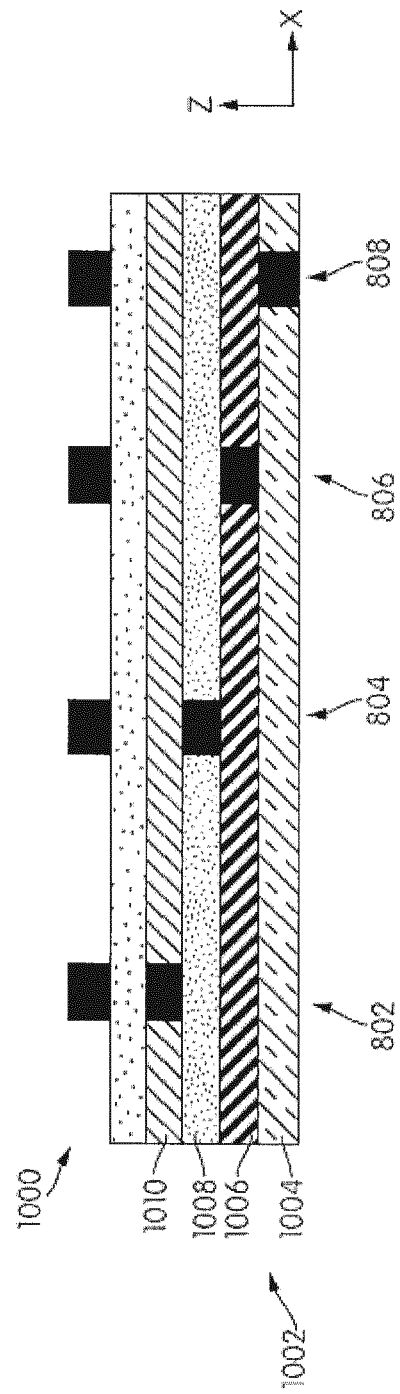
FIG. 3I illustrates use of an extended operating range metrology target according to an embodiment for multiple layer overlay measurement.

Referring to FIG. 3I, the use of an example of an extended operating range metrology target 1000, 1002 (of the design of FIG. 3G) having a plurality of sub-targets for multi-layer overlay is depicted. For ease of reference, the sub-targets 802, 804, 806, 808 are depicted in a row in FIG. 3I. As will be appreciated from the layout of FIG. 3G, the sub-targets 806, 808 in FIG. 3I would in practice be located in "front" or "behind" the sub-targets 802, 804 in FIG. 3I, in or out of the page respectively. Further, in this embodiment, the first extended operating range metrology target 1000 is at one layer and the second extended operating range metrology target 1002 has each of a plurality of sub-targets in different layers. That is, in FIG. 3I, each of the sub-targets 802, 804, 806, 808 of the first extended operating range metrology target 1000 is at a top layer and each of the sub-targets 802, 804, 806, 808 of the second extended operating range metrology target 1002 is in a different layer underneath the first extended operating range metrology target 1000, such that each of the sub-targets 802, 804, 806, 808 of the first extended operating range metrology target 1000 at least partly overlays a respective sub-target 802, 804, 806, 808 of the second extended operating range metrology target 1002.

In the example of FIG. 3I, each of the sub-targets 802, 804, 806, 808 is designed for a different layer. In this example, sub-target 802 is designed for measuring overlay for a first layer-pair of the top layer and layer 1010, sub-target 804 is designed for measuring overlay for a second layer-pair of the top layer and layer 1008, sub-target 806 is designed for measuring overlay for a third layer-pair of the top layer and layer 1006, and sub-target 808 is designed for measuring overlay for a fourth layer-pair of the top layer and layer 1004. While each sub-target in this example measures a different layer-pair, in an embodiment, two or more of the sub-targets may measure a first layer-pair and one or more other sub-targets may measure a second layer-pair. Further, while 4 different layer-pairs are capable of being measured in FIG. 3I, there may be a different number of layer-pairs capable of being measured.

In this embodiment, each of the sub-targets 802, 804, 806, 808 of the first extended operating range metrology target 1000 has a same design and the sub-targets 802, 804, 806, 808 of the first extended operating range metrology target 1000 is the same in terms of design as the sub-targets 802, 804, 806, 808 of the second extended operating range metrology target 1002. However, as noted above, two or more of the sub-targets 802, 804, 806, 808 of the second extended operating range metrology target 1002 are in different layers (and thus of different design), while still underlying the first extended operating range metrology target 1000. In an embodiment, one or more of the sub-targets 802, 804, 806, 808 of the first extended operating range metrology target 1000 may have a different design than another one or more of the sub-targets 802, 804, 806, 808 of the first extended operating range metrology target 1000. In an embodiment, one or more of the sub-targets 802, 804, 806, 808 of the first extended operating range metrology target 1000 may have a different design than one or more of the sub-targets 802, 804, 806, 808 of the second extended operating range metrology target 1002.

In an embodiment, because of the location of each of the sub-targets 802, 804, 806, 808 in the extended operating range metrology target, the overlay for each specific different layer-pair can be readily made. Moreover, since the extended operating range metrology target has sub-targets 802, 804, 806, 808 for each different layer-pair, the measurement of a plurality of different layer-pairs may be taken in one measurement sequence, e.g., the diffraction information each of the different layer-pairs may be captured at once. Instead of or in addition to using the measured overlay value of each different layer-pair separately, the average, median or other statistical value of the measurements using the sub-targets 802, 804, 806, 808 may be used for process control. This may be useful where there is a concern over the specific reliability of one or more of the sub-targets 802, 804, 806, 808 due their smallness. The statistical value can help eliminate anomalies.

Figure 3J:
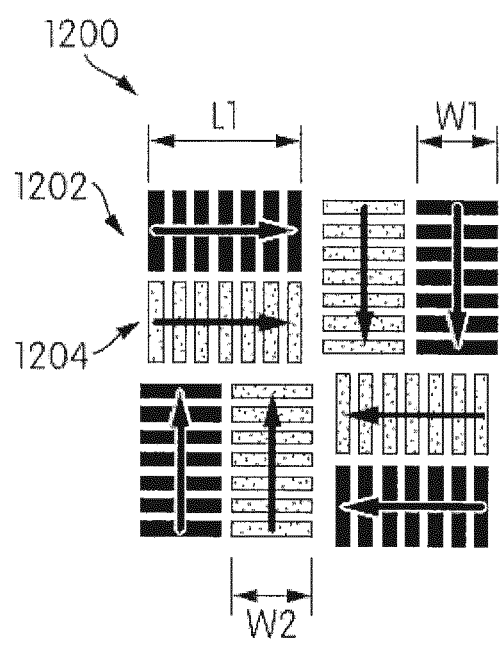
FIGS. 3J and 3K illustrate variations of an extended operating range metrology target according to an embodiment.
Figure 3K:
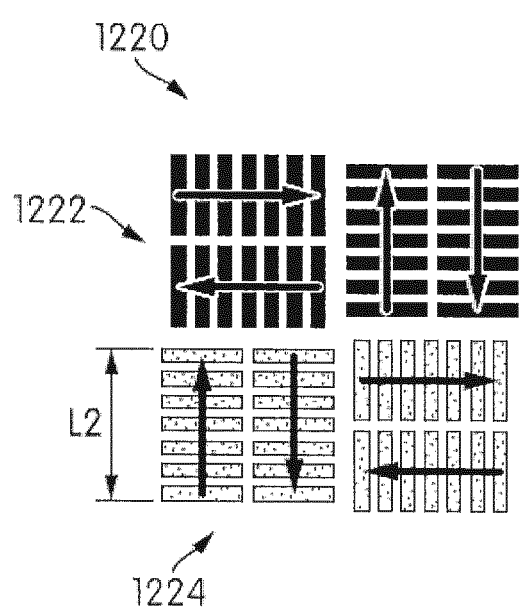

FIGS. 3J and 3K depict some further example embodiments of an extended operating range metrology target. In an embodiment, these embodiments of extended operating range metrology target are designed for multi-layer overlay measurement. However, additionally or alternatively, these extended operating range metrology targets may be used, with appropriate modifications, for process stack variation (i.e., different sub-targets of the extended operating range metrology target are designed for different process stack conditions). Of course, the design possibilities for the extended operating range metrology target are not limited to those depicted in FIGS. 3G, J and K. Different design variations of the extended operating range metrology target are possible to, e.g., accommodate different or more process stack variations, different amounts of layers, different layout constraints, etc. Further, each of the extended operating range metrology target designs in FIGS. 3J and 3K depicts two sub-targets. As will be appreciated, the extended operating range metrology target may have more than two sub-targets.

Referring to FIG. 3J, there is depicted an embodiment of an extended operating range metrology target 1200 having a first sub-target 1202 and a second sub-target 1204. Compared with the extended operating range metrology target of FIG. 3G, the sub-targets are "interleaved" with each other with in this case the periodic structures of the second sub-target 1204 meeting at the center of the extended operating range metrology target 1200 and the periodic structures of the first sub-target 1202 being arranged around the periphery. In this embodiment, the length L1 and width W1 of each periodic structure of the first sub-target 1202 is substantially the same as the length L2 (see FIG. 3K) and width W2 of each periodic structure of the second sub-target 1204. In an embodiment, the length L1, L2 is 8 µm and the width W1, W2 is 4 µm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a bias difference between the first and second sub-targets 1202, 1204. The arrows depict an embodiment of the direction of bias. To be sure a bias is not required or need not be in the directions shown. In an embodiment, the bias is less than or equal to 60 nm. In an embodiment, the extended operating range metrology target 1200 is capable of measuring overlay in the range of 30 nm or less.

Referring to FIG. 3K, there is depicted an embodiment of an extended operating range metrology target 1220 having a first sub-target 1222 and a second sub-target 1224. Each of the sub-targets is a distinct contiguous portion of the extended operating range metrology target 1220. In this case, the first sub-target 1222 is in the "top" part and the second sub-target 1224 is in the "bottom" part. In this embodiment, the length L1 and width W1 of each periodic structure of the first sub-target 1222 is substantially the same as the length L2 and width W2 of each periodic structure of the second sub-target 1224. In an embodiment, the length L1, L2 is 8 µm and the width W1, W2 is 4 µm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a difference in bias between the first and second sub-targets 1222, 1224. The arrows depict an embodiment of the direction of bias. To be sure a bias is not required or need not be in the directions shown. In an embodiment, the bias is less than or equal to 60 nm. In an embodiment, the extended operating range metrology target 1220 is capable of measuring overlay in the range of 30 nm or less.

Figure 3L:
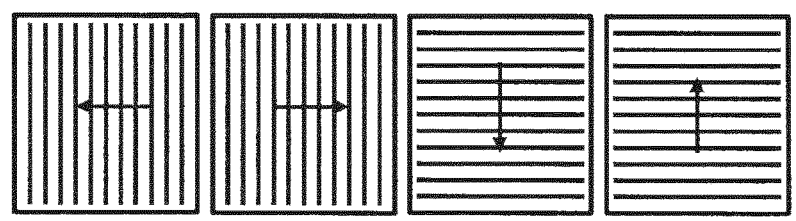
FIG. 3L depicts a form of a multiple periodic structure (e.g., multiple grating) target.
Figure 3M:
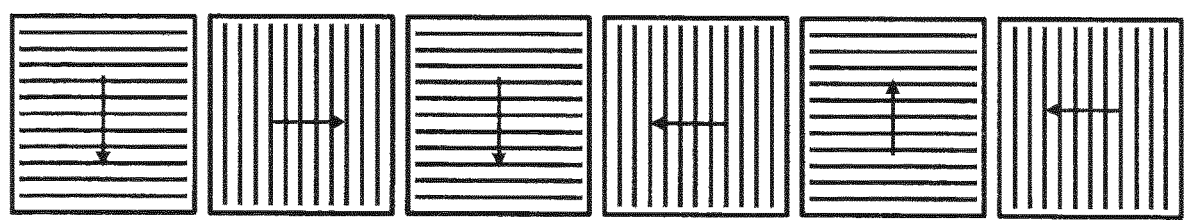
FIG. 3M depicts a form of a multiple periodic structure (e.g., multiple grating) target.

Referring to FIG. 3L and FIG. 3M, there are depicted further embodiments of a metrology target. These targets are akin to the target of FIG. 3E except arranged in a different manner in the case of FIG. 3L and arranged in a different manner and with a different number of periodic structures in FIG. 3M. The arrows depict an embodiment of the direction of bias. To be sure a bias is not required or need not be in the directions shown.

It may be desirable to measure a target having a latent image to determine a characteristic (e.g., overlay, CD, focus, dose, etc.). That is, the latent image form of the target is measured using a metrology tool. Further, it may be desirable to measure the target in post-development form. That is, the post-development image corresponding to the latent image is measured using a metrology tool.

Figure 5A:
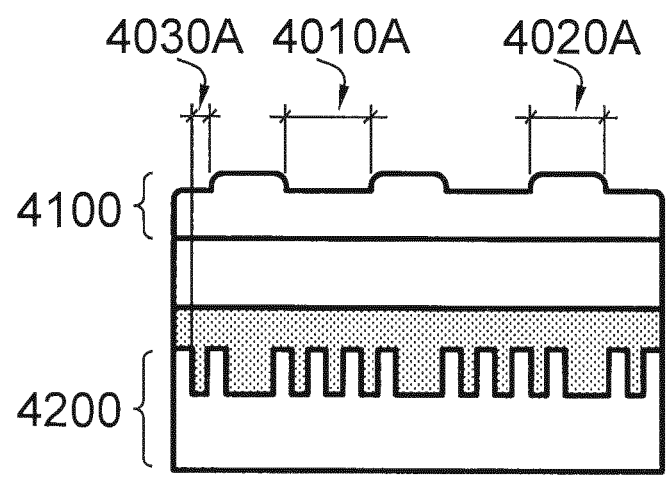
FIG. 5A and FIG. 5B schematically show an example of a target that includes a latent image and a target that includes the developed image of the latent image, respectively.
Figure 5B:
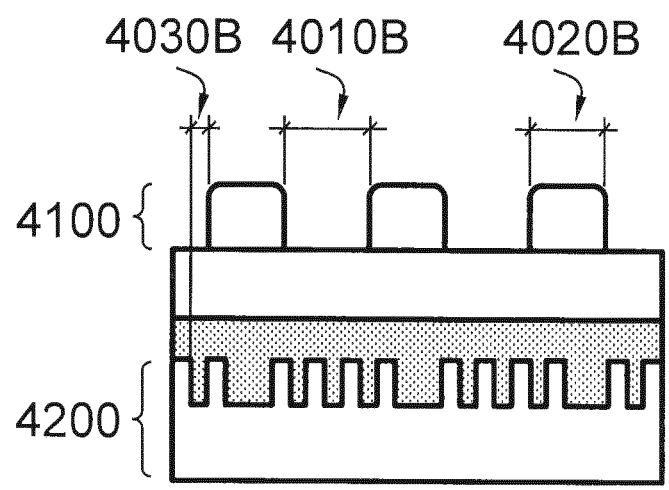

FIG. 5A and FIG. 5B schematically show an example of a target for overlay measurement that includes a latent image and a target that includes a post-development image (e.g., a developed image) of the latent image, respectively. In the target shown in FIG. 5A, the latent image is in a resist layer 4100 before the resist layer 4100 is developed. The latent image comprises variations, in this example, of the thickness of exposed portions 4010A relative to that of unexposed portions 4020A. The exposed portions 4010A and unexposed portions 4020A form a periodic structure (e.g., a grating) but the spatial contrast of the periodic structure is low due to the small difference in thickness of the exposed portions 4010A and unexposed portions 4020A. The periodic structure formed by the exposed portions 4010A and unexposed portions 4020A and a periodic structure 4200 under the resist layer 4100 have an offset 4030A (e.g., an overlay error). In the target shown in FIG. 5B, where the resist layer 4100 has been developed, the exposed portions 4010A are removed and trenches 4010B form in the resist layer 4100 as a result, and the unexposed portions 4020A essentially remain intact and become remaining portions 4020B. The grating formed by the trenches 4010B and the remaining portions 4020B and the grating 4200 under the resist layer 4100 have an offset 4030B. When the development of the resist layer 4100 is proper, the width of the unexposed portions 4020A should be similar to the width of the remaining portions 4020B; the width of the exposed portions 4010A should be similar to the width of the trenches 4010B; the pitch before development (i.e., the sum of the widths of the exposed portions 4010A and the unexposed portions 4020A) should essentially equal the pitch after development (i.e., the sum of the widths of the exposed portions 4010B and the unexposed portions 4020B); and the offsets 4030A and 4030B should be similar.

As described above, a latent image usually comprises small variations in the refractive index, extinction coefficient and/or thickness of the resist layer because the exposed portions of the resist layer may be slightly thicker or thinner and/or have a different refractive index and/or extinction coefficient than unexposed portions of the resist layer (e.g., after PEB). So, the spatial contrast of a latent image tends to be low. If a substrate measurement recipe has a target including a latent image, the low spatial contrast of the latent image can lead to low magnitudes of diffraction orders from that target other than the zeroth order, if the parameters of the substrate measurement recipe are not properly adjusted. A low magnitude of non-zero diffraction orders makes the target difficult to measure. Therefore, a properly adjusted substrate measurement recipe having a target including a latent image should have relatively high detectability such as a high magnitude of at least some non-zeroth diffraction orders.

Further, it can be desirable to measure a target in latent image form as well as in post-development image form. That is, the target can be measured in latent image form and further be measured after it has been developed, e.g., a developed image form in resist, an etched image form in another layer, etc. Accordingly, it is desirable to have similar performance for both the latent image form and the post-development image form.

Thus, a substrate measurement recipe having a target including a latent image could be different than a substrate measurement recipe having a post-development image corresponding to the latent image. For example, a target designed for latent and post-development measurement might have a different design (e.g., with respect to feature width (CD), segmentation (e.g., segmentation of features into sub-features), etc.) than one designed for only post-development measurement.

Taking the overlay context as an example, a latent image should not shift relative to the substrate when the resist layer is developed. That is, the location of the latent image of the target relative to a structure under the resist layer should remain similar or the same after the image is developed. Therefore, a properly adjusted substrate measurement recipe having a target including a latent image should yield a similar or a same result (e.g., overlay) as a substrate measurement recipe having a target including a post-development image corresponding to the latent image. Thus, the substrate measurement recipe having a target including a latent image can have a difference in one or more its parameters from the substrate measurement recipe having a target including a post-development image corresponding to the latent image.

Those differences can be various. For example, staying with the overlay context, the diffraction strength of an upper periodic structure of a target should be comparable to that of a lower periodic structure of the target which it overlies. But, a latent upper periodic structure will have a smaller diffraction strength compared to a developed upper periodic structure. So, to bring back the balance, the diffraction strength of the lower periodic structure (in case of a latent upper structure) can be tuned by reducing its diffraction strength by, e.g., using a different feature width (CD) and/or applying a certain kind of segmentation. Additionally or alternatively, a measurement parameter (e.g., measurement beam wavelength, measurement beam polarization, measurement beam spatial distribution, etc.) can be tuned relative to use of the target only for post-development measurement. As another example, in addition to or alternatively to having one or more parameters of the target itself and/or of the measurement tuned as described above, two substrate measurement recipes for the target may use a different measurement parameter for the measurement of the target when in latent image form than for the measurement of the target when in post-development image form (e.g., different measurement beam wavelength, different measurement polarization, different measurement beam spatial distribution, etc.).

So, in an embodiment, there is provided a method of designing a substrate measurement recipe for a target (e.g., a target design, which can include a combination of patterns for at least two layers) which achieves a correct measurement result when a latent image of the target is measured before development (e.g., development of the upper pattern of patterns in at least two layers).

So, in an embodiment, methods herein provide metrology (e.g., overlay measurement) consistency between both latent and post-development processes. For example, target simulation can be used to arrive at one or more substrate measurement recipes that enable the same or comparable results independent of the type of process (e.g., latent resist target image, developed resist target image, etched target image, etc.) when the target on a substrate is measured using a metrology tool. So, for example, by optimizing one or more substrate measurement recipe parameters, a situation can be obtained wherein a measured result (e.g., overlay) for both the measured latent image and the measured post-development image are the same, or within a tolerance range, so as to obtain similar accuracy, robustness and/or reliability.

While the discussion herein may focus on diffraction-based optical targets, the techniques herein can be used with any appropriate target (e.g., image based optical targets, the extended operating range metrology target, etc.) to obtain a reliable signal that helps ensure robust, accurate and consistent measurement.

Further, while the discussion herein may focus on overlay, the techniques herein can be used to measure other parameters (e.g., dose used to expose the target, focus used to expose the target, optical aberrations during exposure of the target, etc.).

As discussed above, arriving at the substrate measurement recipe for a target having a latent image can be done using computation (e.g., simulation). Specifically, the result (e.g., overlay, alignment, focus, dose, etc.) obtained by measuring using a substrate measurement recipe may be computed. In the computation, characteristics of the radiation used to measure the target used in the substrate measurement recipe are determined from the one or more parameters $r_i$ of the substrate measurement recipe (if there are any); characteristics of the target are determined from the one or more parameters $t_j$ of the substrate measurement recipe (if there are any). The interaction between the radiation and the target can be determined from the one or more parameters $r_i$ and/or the one or more parameters $t_j$ of the substrate measurement recipe. The result of a computed measurement using the one or more parameters of the substrate measurement recipe can be determined from the interaction.

So, in an embodiment, a computation (e.g., simulation) can be performed, in accordance with one or more parameters of a substrate measurement recipe, to evaluate a characteristic (e.g., overlay, CD, alignment, stack sensitivity, target coefficient, overlay impact, measurement signal, etc.) determined from a computed measurement with a latent image of a target corresponding to the substrate measurement recipe and determined from a computed measurement with a post-development image corresponding to the latent image. One or more parameters of the substrate measurement recipe can then be adjusted and the computation re-performed until a certain termination condition is satisfied with respect to the characteristic.

In an embodiment, the evaluating and adjusting can be used to compare the characteristic (e.g., overlay, CD, alignment, stack sensitivity, target coefficient, etc.) determined from the computed (e.g., simulated) measurement with the latent image with that determined from the computed (e.g., simulated) measurement with the post-development image corresponding to the latent image and/or to compare the characteristic determined from the computed (e.g., simulated) measurement with the latent image and from the computed (e.g., simulated) measurement with the post-development image against a standard (e.g., a common standard or a different standard for the latent image compared to the post-development image). For example, the characteristic can characterize detectability of the substrate measurement recipe. For example, the characteristic can characterize robustness of the substrate measurement recipe to perturbation. For example, the characteristic can be stack sensitivity and/or target coefficient, which can be cross-compared to help ensure that measurement with the latent image achieves comparable values as measurement with the post-development image and/or the stack sensitivity/target coefficient of measurement with the latent image and measurement with the post-development image can be compared against a threshold (e.g., kept to below or equal to a certain value or kept to above or equal to a certain value).

Accordingly, the termination condition can be that the determined characteristic for the latent image measurement is the same as, or within a specific range of tolerance, of the determined characteristic for the post-development measurement. The termination condition can be that the determined characteristic for the latent image measurement and the determined characteristic for the post-development measurement are the same as, or within a range of tolerance, of a certain value of the characteristic (which can be set in the computation/simulation).

The evaluating and adjusting can be used to determine the accuracy, robustness or consistency of a characteristic (e.g., overlay, CD, alignment, etc.) determined from the computed (e.g., simulated) measurement with the latent image and determined from the computed (e.g., simulated) measurement with the post-development image corresponding to the latent image. In an embodiment, the evaluating of the characteristic determined from the computed (e.g., simulated) measurement with the latent image and determined from the computed (e.g., simulated) measurement with the post-development image corresponding to the latent image can be relative to a standard (e.g., a common standard such as expected CD or expected overlay for an example accuracy check or a different standard for the latent image compared to the post-development image). In an embodiment, the characteristic determined from the computed (e.g., simulated) measurement with the latent image can be evaluated relative to the characteristic determined from the computed (e.g., simulated) measurement with the post-development image corresponding to the latent image (e.g., to determine whether the characteristic is the same, or within a tolerance range, for both the computed (e.g., simulated) measurement with the latent image and computed (e.g., simulated) measurement with the post-development image).

Thus, in an accuracy embodiment, the termination condition can be that the determined characteristic for the latent image measurement is the same as, or within a specific range of tolerance, of the determined characteristic for the post-development measurement. The termination condition can be that the determined characteristic for the latent image measurement and the determined characteristic for the post-development measurement are the same as, or within a range of tolerance, of a true value of the characteristic (which can be set in the computation/simulation).

In a robustness embodiment, the termination condition can be that the determined characteristic for the latent image measurement is equally, or within a specific range of tolerance, robust to variations as the determined characteristic for the post-development measurement. The termination condition can be that the determined characteristic for the latent image measurement and the determined characteristic for the post-development measurement match, or are within a range of tolerance, of a certain robustness measure (which can be set in the computation/simulation). Moreover, in the robustness embodiment, the computation/simulation may apply a perturbation (e.g., within 1%, within 2%, within 5%, etc.) to one or more parameters/variables to assess the robustness of the characteristic to such change.

In a consistency embodiment, the termination condition can be that the determined characteristic for the latent image measurement is equally, or within a specific range of tolerance, consistent as the determined characteristic for the post-development measurement. The termination condition can be that the determined characteristic for the latent image measurement and the determined characteristic for the post-development measurement match, or are within a range of tolerance, of a certain consistency measure (which can be set in the computation/simulation).

The one or more parameters (e.g., just one parameter, a plurality of parameters, or all of the parameters) adjusted can include one or more target parameters, one or more measurement parameters, or both. For example, one or more parameters of the target may be adjusted including, e.g., the widths of the exposed and unexposed portions, a geometric parameter (e.g., CD, segmentation, etc.) of a periodic structure underneath the latent image, etc.

So, in an embodiment, an evaluation or optimization metric can be based on a difference between a result or characteristic of a substrate measurement recipe for a latent image of a target and a result or characteristic of a substrate measurement recipe for post-development image of a target. In an embodiment, the evaluation or optimization can involve determining whether the measurement of the latent image of a target and of the post-development image corresponding to the latent image achieve a true result or characteristic, desirably in the presence of perturbations (e.g., where an upper pattern of a target perfectly overlies a lower pattern of a target in the computation/simulation, there is no or small overlay error in the presence of perturbations such a perturbation in side wall angle of features of the pattern(s), floor tilt in the pattern(s), roof tilt in the pattern(s), etc.)

Thus, in an embodiment, there is provided a method comprising: computing, by a hardware computer system in accordance with one or more parameters of a substrate measurement recipe, measurement with a latent image of a target and measurement with a post-development image corresponding to the latent image, to evaluate a characteristic determined from the measurement with the latent image of the target and determined from the measurement with the post-development image corresponding to the latent image; and adjusting the one or more parameters of the substrate measurement recipe and re-performing the computing, until a certain termination condition is satisfied with respect to the characteristic.

So, in an embodiment, the method performs a substrate measurement recipe design simulation to find a substrate measurement recipe (e.g., a combination of target pitch, target CD, etc.) that is optimized for both latent and post-development measurement.

Figure 6:
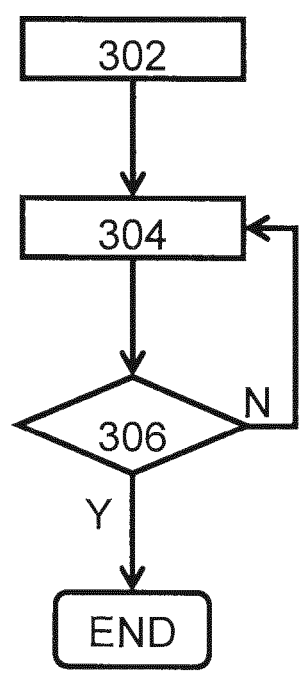
FIG. 6 is a flow diagram illustrating aspects of an example methodology of substrate measurement recipe design.

A general method of substrate measurement recipe design, according to an embodiment, is illustrated in FIG. 6. This method comprises a step 302 of computing/simulating the latent image measurement and post-development image measurement according to one or more parameters of a substrate measurement recipe to determine a characteristic from the latent image computed measurement and from the post-development image computed measurement.

In an embodiment, the computing/simulating may comprise evaluating a multi-variable cost function of a plurality of design variables. The design variables may comprise one or more of the parameters of the substrate measurement recipe. In an embodiment, the cost function or characteristic represents a metric characterizing a degree of similarity between a result (e.g., overlay, alignment, focus) for measurement of a target including a latent image and a result for measurement using a target including a post-development image of the latent image. The cost function or characteristic may further represent or be constrained by detectability of the target including the latent image.

In step 304, one or more of the parameters/design variables are adjusted for re-computation/re-simulation. In an embodiment, a plurality of parameters/design variables are simultaneously adjusted (i.e., joint optimization/co-optimization) so that the computation/simulation can reach toward a termination condition (e.g., a cost function is moved towards convergence).

In step 306, it is determined whether a predefined termination condition is satisfied. The predetermined termination condition may include various possibilities, such as one or more of the ones described above. The termination condition can be, e.g., one or more selected from: the cost function or characteristic is minimized or maximized, as required by the numerical technique used, the value of the cost function or characteristic is equal to a threshold value or crosses the threshold value, the value of the cost function or characteristic reaches within a preset error limit, and/or a preset number of iterations is reached. If a condition in step 306 is satisfied, the method ends. If the one or more conditions in step 306 is not satisfied, the steps 304 and 306 are iteratively repeated until a desired result is obtained. The method does not necessarily lead to a single set of values for the one or more design variables because there may be a physical restraint. The process may provide multiple sets of values for the one or more design variables and allows a user to pick one or more sets.

Figure 7:
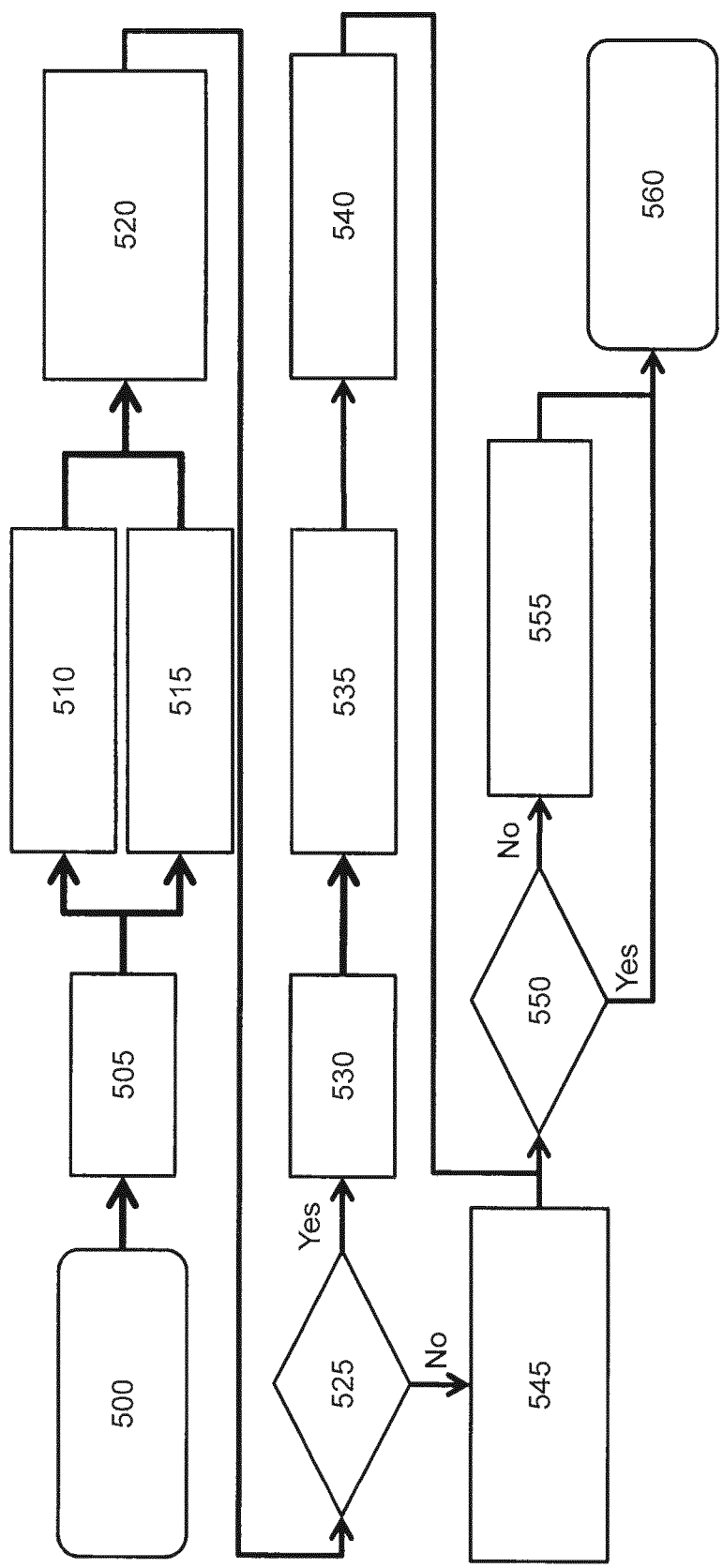
FIG. 7 is a flow diagram illustrating aspects of an example methodology of substrate measurement recipe design.

FIG. 7 is a flow diagram illustrating aspects of a further example methodology of substrate measurement recipe design. At 500, the substrate measurement recipe design methodology begins for designing a substrate measurement recipe for a latent image and post-development image of a target. At 505, input parameters are obtained. For example, one or more fixed parameters can be identified. Further, base values of one or more variables/parameters of a substrate measurement recipe can be identified. At 510, one or more materials parameters (e.g., refractive index, extinction coefficient, thickness, etc.) can be obtained (e.g., by measurement) of a process stack on which, or in which, the target will be provided. These parameters will be used in the computation at 520. Further, at 515, one or more materials parameters (e.g., refractive index, extinction coefficient, thickness, etc.) can be obtained (e.g., by measurement) of the resist process, before exposure and after post-exposure bake, in which a latent image of the target will be formed. These parameters will be used in the computation at 520.

At 520, computation/simulation is performed as described above to enable substrate measurement recipe design to find a substrate measurement recipe (e.g. a target design in terms of pitch, CD, segmentation, etc.) that is optimized for both latent image measurement and post-development image measurement. Such computation can involve determining the interaction of radiation with the target, the resist and the process stack and so the parameters of 510, 515 can be used in that respect.

At 525, it is determined whether an optimal measurement recipe for both latent image measurement and post-development image measurement has been found. If so, at 530, appropriate information can be generated to produce the target (e.g., a GDS file for reticle tape-out), including production or programming of a patterning device. Further, at 535, a substrate can be exposed with the target corresponding to the found substrate measurement recipe and the latent image (e.g., after post exposure bake) can be measured. Based on, e.g., the measurement, a further optimization may be performed using one or more of the parameters of the found substrate measurement recipe. For example, the target design parameters may be kept as they are but one or more measurement parameters may be changed to find an optimal measurement condition. At 540, the latent image is developed and the post-development image can be measured. Based on, e.g., the measurement, a further optimization may be performed using one or more of the parameters of the found substrate measurement recipe. For example, the target design parameters may be kept as they are but one or more measurement parameters may be changed to find an optimal measurement condition.

If no substrate measurement recipe was found at 525, then at 545, two substrate measurement recipe with different target designs (e.g., of different pitch, CD, etc.) can be produced—one for the latent image and the other for the post-development image. In an embodiment, the two target designs are sub-targets of an extended operating range metrology target.

Then, it can be checked at 550, whether the substrate measurement recipe(s) produce a same, or within a tolerance range, result (e.g., overlay, measurement signal, CD, etc.) for measurement of the latent image and measurement of the post-development image. If no, a calibration or offset function can be used to match the results for the measurement of the latent image to the results of the measurement of the post-development image. Then, at 560, an optimal substrate measurement recipe(s) for measurement of the latent image and the post-development image has been produced.

In an embodiment, design variables can be adjusted alternately (referred to as Alternate Optimization) or adjusted simultaneously (referred to as Simultaneous Optimization). The terms "simultaneous", "simultaneously", "joint" and "jointly" as used herein mean that the design variables are allowed to change at the same time. The term "alternate" and "alternately" as used herein mean that not all of the design variables are allowed to change at the same time.

Figure 8:
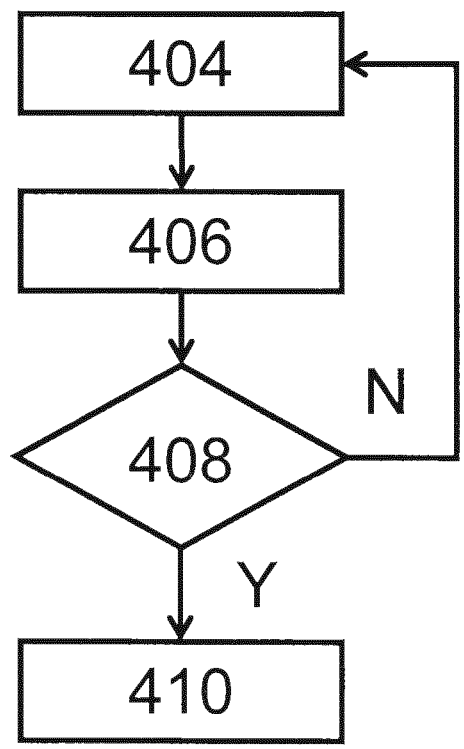
FIG. 8 is a flow diagram illustrating aspects of an example methodology of substrate measurement recipe design.

In FIGS. 6 and/or 7, an optimization of design variables can be executed simultaneously. Such a flow may be called simultaneous flow or co-optimization flow. Alternately, the optimization of the design variables is executed alternately, an example of which is illustrated in FIG. 8. In this flow, in each step, one or more design variables are fixed while one or more design variables are optimized to optimize the cost function; then in the next step, a different set of one or more variables are fixed while the one or more others are optimized to minimize or maximize the cost function. These steps are executed alternately until convergence or a certain terminating condition is met. As shown in the non-limiting example flowchart of FIG. 8, in step 404, where a first group of design variables (e.g., one or more parameters of the target itself) are adjusted to minimize or maximize the cost function while a second group of design variables (e.g., one or more parameters of the measurement of the target) are fixed. Then in the next step 406, the second group of design variables is adjusted to minimize or maximize the cost function while the first group of design variables is fixed. These two steps are executed alternately, until a certain terminating condition is met in step 408. One or more various termination conditions can be used, such as the value of the cost function becomes equal to a threshold value, the value of the cost function crosses the threshold value, the value of the cost function reaches within a preset error limit, a preset number of iterations is reached, etc. Finally the output of the optimization result is obtained in step 410, and the process stops.

As an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a metric characterizing a degree of similarity between a result of a substrate measurement recipe having a target including a latent image and a result of a substrate measurement recipe having a target including a developed image of the latent image, for a set of values of the design variables of $(z_1, z_2, \ldots, z_N)$. $f_p(z_1, z_2, \ldots, z_N)$ can be a metric characterizing detectability of the substrate measurement recipe. $f_p(z_1, z_2, \ldots, z_N)$ can be a metric characterizing robustness of the substrate measurement recipe, namely how much the result of the substrate measurement recipe varies under perturbation. $w_p$ is a weight constant associated with $f_p(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

In one embodiment, the design variables $(z_1, z_2, \ldots, z_N)$ comprise one or more parameters selected from the substrate measurement recipe. The design variables can include any adjustable parameters of the substrate measurement recipe. For example, the design variables $(z_1, z_2, \ldots, z_N)$ may include measurement beam wavelength, measurement beam polarization, and spatial/angular distribution of measurement beam illumination used in the substrate measurement recipe. For example, the design variables $(z_1, z_2, \ldots, z_N)$ may include one or more geometric parameters (e.g., feature CD, feature pitch, feature segmentation, etc.) of the target of the substrate measurement recipe.

The metrology apparatus may include a component that adjusts the shape of a wavefront and intensity distribution and/or phase shift of a radiation beam directed to the target. The metrology apparatus can adjust a wavefront and intensity distribution at any location along an optical path of the metrology apparatus, such as before the target, near a pupil plane, near an image plane, and/or near a focal plane. The design variables may include one or more parameters of this component or one or more parameters of the spatial and/or phase distribution of the radiation beam.

The parameters/design variables may have constraints, which can be expressed as $(z_1, z_2, \ldots, z_N) \in Z$, where Z is a set of possible values of the parameters/design variables. One possible constraint may be that the detectability of the target is higher than a threshold. Another possible constraint may be the robustness or stability of the substrate measurement recipe (i.e., how much the result of the substrate measurement recipe varies under a perturbation) is higher than a threshold. Without such a constraint, the process may yield a substrate measurement recipe that yields too weak signals or that is too unstable. However, the usefulness of constraints should not be interpreted as a necessity.

In an embodiment, the process therefore is to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg\min_{(z_1, z_2, \ldots, z_N) \in Z} CF(z_1, z_2, \ldots, z_N) \quad \text{(Eq. 2)}$$

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1, 2, . . . N) exist). An algorithm, such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( \sum_{n=1}^{N} \frac{f_p(z_{1i}, z_{2i}, \ldots, z_{Ni}) + \frac{\partial f_p(z_1, z_2, \ldots, z_N)}{\partial z_n}\bigg|_{z_1=z_{1i}, z_2=z_{2i}, \ldots z_N=z_{Ni}} (z_n - z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \ldots, z_N)}{\partial z_n} = 0,$$

wherein n=1, 2, . . . , N.

If the design variables $(z_1, z_2, \ldots, z_N)$ are under constraints in the form of J inequalities (e.g. tuning ranges of $(z_1, z_2, \ldots, z_N)$) $\sum_{n=1}^{N} A_{nj} z_n \leq B_j$, for j=1, 2, . . . , J; and K equalities (e.g. interdependence between the design variables) $\sum_{n=1}^{N} C_{nk} z_n \leq D_k$, for k=1, 2, ..., K, the process becomes a classic quadratic programming problem, wherein $A_{nj}$, $B_j$, $C_{nk}$, $D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press). One example of the constraints is that the design variables should not have values that cause the target to have detectability below a threshold.

Instead of minimizing the RMS of $f_p(z_1, z_2, \ldots, z_N)$, the process can minimize magnitude of the largest deviation (the worst defect) among the characteristics to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p} \quad \text{(Eq. 5)}$$

wherein $CL_p$ is the maximum allowed value for $f_p(z_1, z_2, \ldots, z_N)$. This cost function represents the worst defect among the characteristics. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q \quad \text{(Eq. 6)}$$

wherein q is an even positive integer such as at least 4, or at least 10. Eq. 6 mimics the behavior of Eq. 5, while allowing the process to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for p=1, ... P, $$\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} \quad \text{(Eq. 6')}$$

$$z_n \leq E_{Up} + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} - f_p(z_{1i}, z_{2i}, \ldots, z_{Ni}) \text{ and}$$

$$-\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} \quad \text{(Eq. 6'')}$$

$$z_n \leq -E_{Up} - \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} + f_p(z_{1i}, z_{2i}, \ldots, z_{Ni})$$

Since Eq. 3 is generally valid only in the vicinity of $(z_1, z_2, \ldots, z_N)$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th characteristic is the worst defect, $w_r$ can be increased in the (i+1)-th iteration so that the reduction of that characteristic's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda) \sum_{p=1}^{P} w_p f_p^2(z_1, z_2, \ldots, z_N) + \quad \text{(Eq. 6''')}$$

$$\lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

In an embodiment, stack sensitivity (SS) can be understood as a measure of how much the intensity of the signal changes as overlay changes because of diffraction between target (e.g., grating) layers. It is thus an example measure of robustness or sensitivity of the measurement. Target coefficient (TC) can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Thus, target coefficient is an example measure of detectability. Overlay impact (OV) measures the change in overlay error as a function of target design. Thus, overlay impact is an example measure of robustness or sensitivity.

In an embodiment, there is provided a method comprising: computing, by a hardware computer system in accordance with one or more parameters of a substrate measurement recipe, measurement with a latent image of a target and measurement with a post-development image corresponding to the latent image, to evaluate a characteristic determined from the measurement with the latent image of the target and determined from the measurement with the post-development image corresponding to the latent image; and adjusting the one or more parameters of the substrate measurement recipe and re-performing the computing, until a certain termination condition is satisfied with respect to the characteristic.

In an embodiment, the computing comprises computing a multi-variable cost function, the multi-variable cost function representing a metric characterizing a degree of similarity between the characteristic determined from the computed measurement with the latent image of the target and determined from the computed measurement with the post-development image corresponding to the latent image, the metric being a function of a plurality of design variables that comprise a parameter of the substrate measurement recipe, and the adjusting comprises adjusting one or more variables of the cost function. In an embodiment, the characteristic is one or more selected from: overlay, alignment, focus, dose, a measurement signal, an accuracy parameter, a robustness parameter, and/or a detectability parameter. In an embodiment, the computing comprises simulating the measurement with the latent image of the target and the measurement with the post-development image corresponding to the latent image. In an embodiment, the simulating comprises determining a characteristic of radiation used to measure the target from a parameter of the substrate measurement recipe. In an embodiment, the simulating comprises determining an interaction between the radiation and the target of the substrate measurement recipe from the parameter of the substrate measurement recipe. In an embodiment, the latent image comprises a spatial distribution of a characteristic of resist in the resist layer before the resist layer is developed. In an embodiment, the latent image comprises variations of thickness, refractive index, and/or extinction coefficient of exposed and unexposed portions of the resist layer. In an embodiment, the substrate measurement recipe for the latent image of the target has a different measurement beam wavelength, different measurement polarization, and/or different measurement beam spatial or angular distribution, than the substrate measurement recipe for the post-development image corresponding to the latent image. In an embodiment, the one or more parameters comprise a geometric or materials parameter of the target comprising the latent image. In an embodiment, the one or more parameters comprise a parameter of measurement of the target comprising the latent image. In an embodiment, the characteristic represents detectability of the target comprising the latent image. In an embodiment, the characteristic represents stability of a measurement result of the target comprising the latent image, with respect to perturbation. In an embodiment, the one or more parameters are under a constraint that detectability of the target comprising the latent image crosses or equals a threshold. In an embodiment, the one or more parameters are under a constraint that stability of a measurement result of the target comprising the latent image with respect to perturbation crosses or equals a threshold. In an embodiment, the target comprising the latent image further comprises a structure under the resist layer. In an embodiment, the termination condition comprises one or more selected from the following: minimization of the characteristic; maximization of the characteristic; reaching a certain number of iterations; reaching a value of the characteristic that crosses or matches a certain threshold value; reaching a certain computation time; or reaching a value of the characteristic within an acceptable error limit.

In an embodiment, there is provided a computer program product comprising a non-transitory computer readable medium having instructions recorded thereon, the instructions when executed by a computer system implementing a method as described herein.

Figure 9:
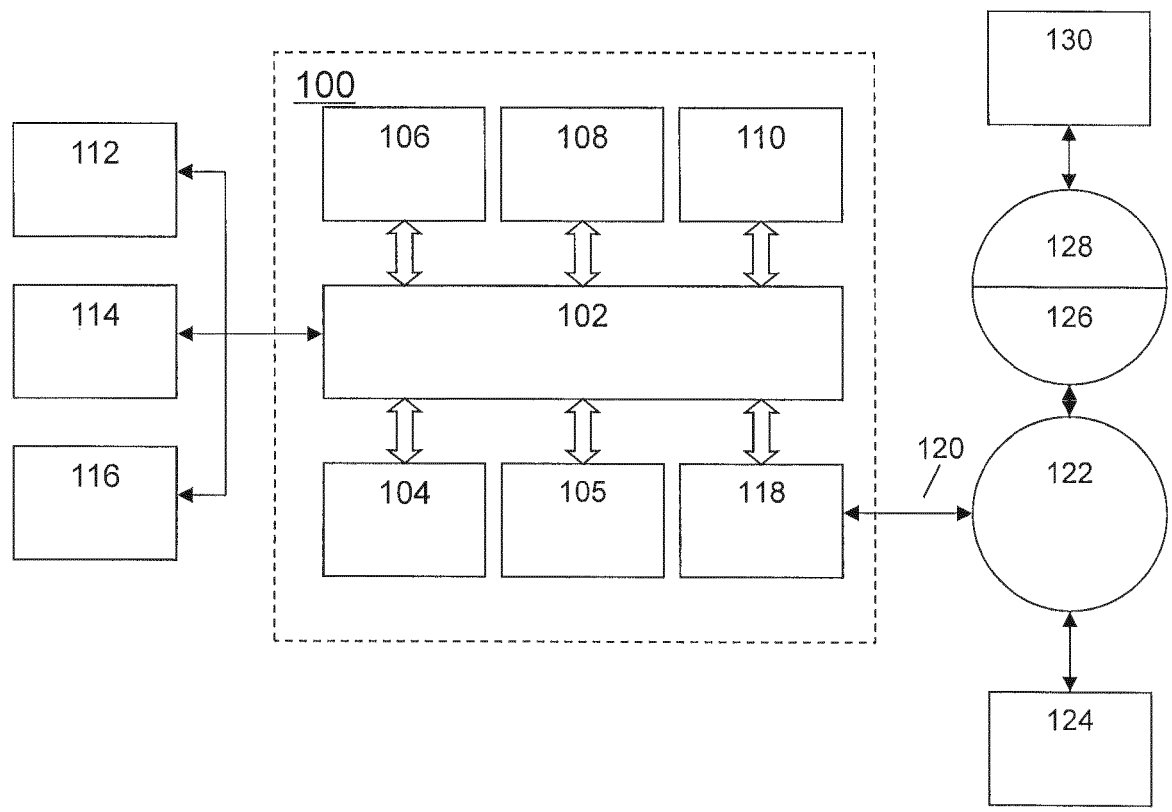
FIG. 9 is a block diagram of an example computer system.

FIG. 9 is a block diagram that illustrates a computer system 100 which can assist in implementing a method or flow as disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 10:
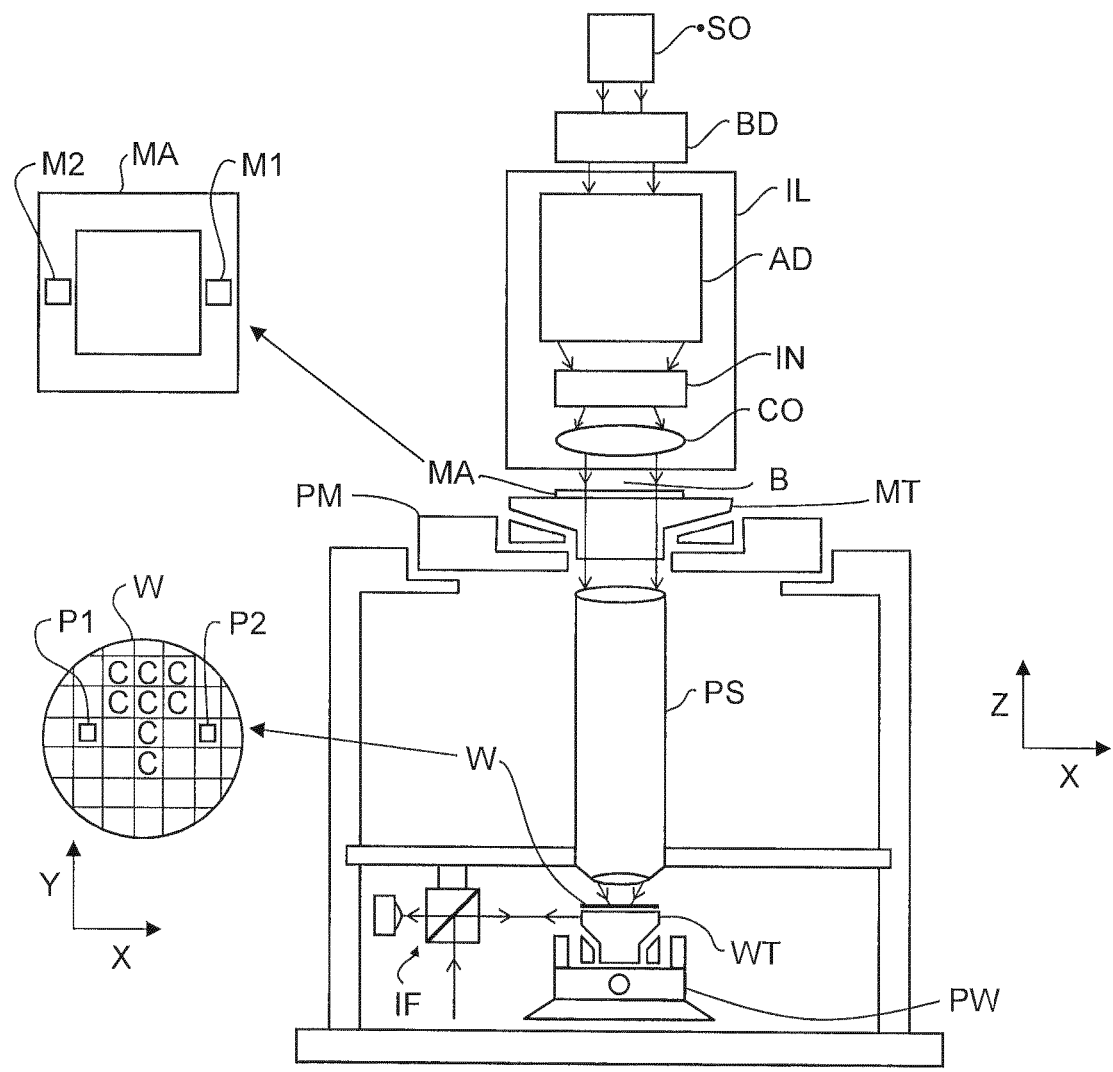
FIG. 10 is a schematic diagram of a lithography apparatus.

FIG. 10 schematically depicts an exemplary lithography apparatus whose illumination could be optimized utilizing the methods described herein. The apparatus comprises:

- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 10 that the source SO may be within the housing of the lithography apparatus (as is often the case when the source SO is a mercury lamp, for example), but that it may also be remote from the lithography apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 10. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 11:
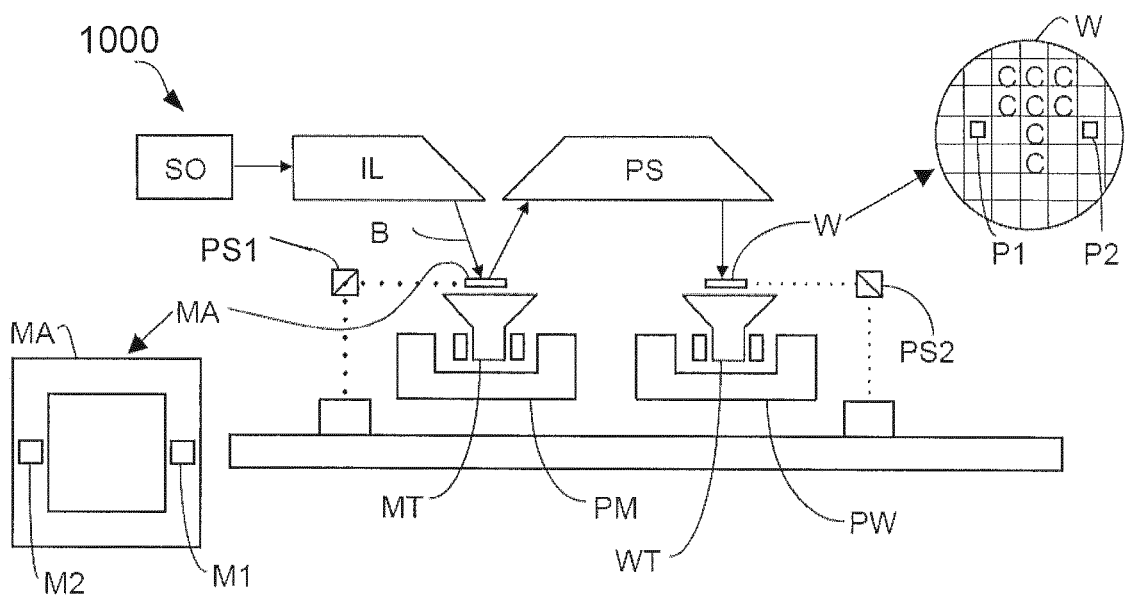
FIG. 11 is a schematic diagram of another lithography apparatus.

FIG. 11 schematically depicts another exemplary lithography apparatus 1000 whose illumination could be optimized utilizing the methods described herein.

The lithography apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 11, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 11, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithography apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 12:
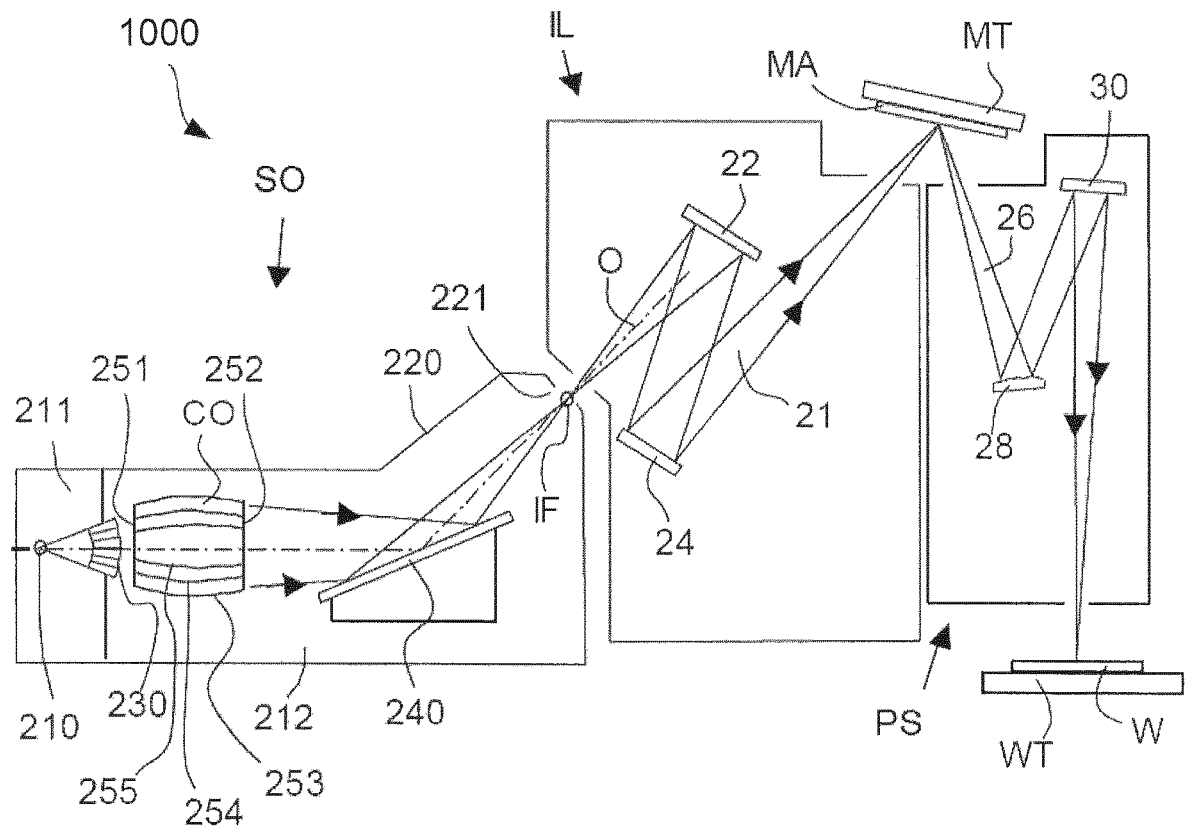
FIG. 12 is a more detailed view of the apparatus in FIG. 11.

FIG. 12 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithography apparatus. Further, there may be more mirrors present than those shown, for example there may be 1-6 additional reflective elements present in the projection system PS than shown in FIG. 12

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 13:
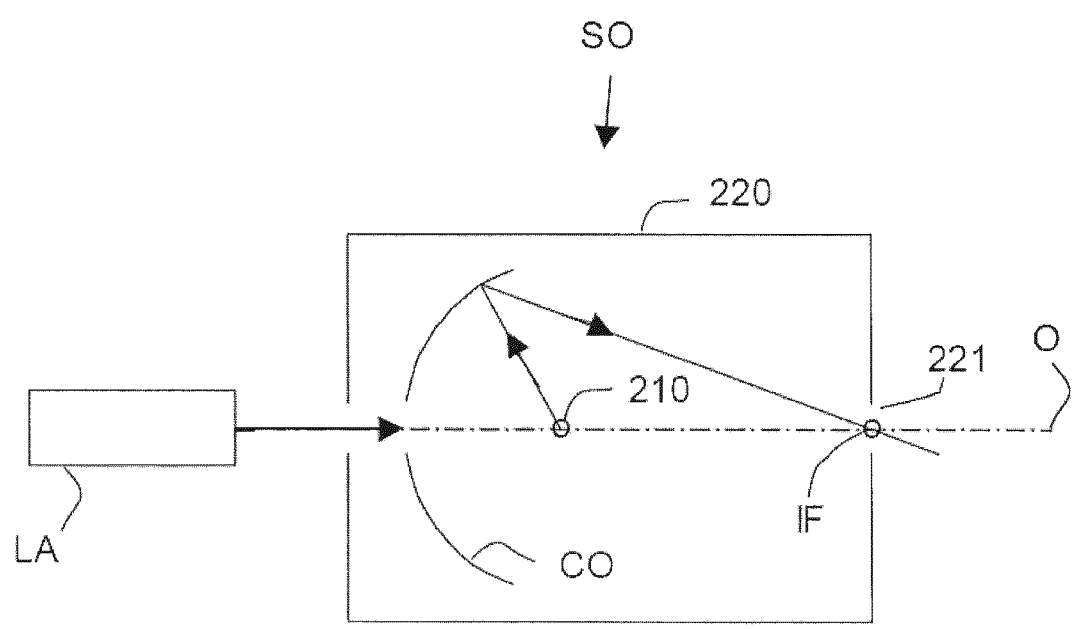
FIG. 13 is a more detailed view of the source collector module SO of the apparatus of FIG. 11 and FIG. 12.

Alternatively, the source collector module SO may be part of an LPP radiation system as shown in FIG. 13. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method comprising:
computing, by a hardware computer system in accordance with one or more parameters of a substrate measurement recipe, measurement with a latent image of a target and measurement with a post-development image corresponding to the latent image, to evaluate a characteristic determined from the computed measurement with the latent image of the target and determined from the computed measurement with the post-development image corresponding to the latent image; and adjusting the one or more parameters of the substrate measurement recipe and re-performing the computing, until a certain termination condition is satisfied with respect to the characteristic.

2. The method of clause 1, wherein the computing comprises computing a multi-variable cost function, the multi-variable cost function representing a metric characterizing a degree of similarity between the characteristic determined from the computed measurement with the latent image of the target and determined from the computed measurement with the post-development image corresponding to the latent image, the metric being a function of a plurality of design variables that comprise a parameter of the substrate measurement recipe, and the adjusting comprises adjusting one or more variables of the cost function.

3. The method of clause 1 or clause 2, wherein the characteristic is one or more selected from: overlay, alignment, focus, dose, a measurement signal, an accuracy parameter, a robustness parameter, and/or a detectability parameter.

4. The method of any of clauses 1 to 3, wherein the computing comprises simulating the measurement with the latent image of the target and the measurement with the post-development image corresponding to the latent image.

5. The method of clause 4, wherein the simulating comprises determining a characteristic of radiation used to measure the target from a parameter of the substrate measurement recipe.

6. The method of clause 4 or 5, wherein the simulating comprises determining an interaction between the radiation and the target of the substrate measurement recipe from the parameter of the substrate measurement recipe.

7. The method of any of clauses 1 to 6, wherein the latent image comprises a spatial distribution of a characteristic of resist in the resist layer before the resist layer is developed.

8. The method of any of clauses 1 to 7, wherein the latent image comprises variations of thickness, refractive index, and/or extinction coefficient of exposed and unexposed portions of the resist layer.

9. The method of any of clauses 1 to 8, wherein the substrate measurement recipe for the latent image of the target has a different measurement beam wavelength, different measurement polarization, and/or different measurement beam spatial or angular distribution, than the substrate measurement recipe for the post-development image corresponding to the latent image.

10. The method of any of clauses 1 to 9, wherein the one or more parameters comprise a geometric or materials parameter of the target comprising the latent image.

11. The method of any of clauses 1 to 10, wherein the one or more parameters comprise a parameter of measurement of the target comprising the latent image.

12. The method of any of clauses 1 to 11, wherein the characteristic represents detectability of the target comprising the latent image.

13. The method of any of clauses 1 to 12, wherein the characteristic represents stability of a measurement result of the target comprising the latent image, with respect to perturbation.

14. The method of any of clauses 1 to 13, wherein the one or more parameters are under a constraint that detectability of the target comprising the latent image crosses or equals a threshold.

15. The method of any of clauses 1 to 14, wherein the one or more parameters are under a constraint that stability of a measurement result of the target comprising the latent image with respect to perturbation crosses or equals a threshold.

16. The method of any of clauses 1 to 15, wherein the target comprising the latent image further comprises a structure under the resist layer.

17. The method of any of clauses 1 to 16, wherein the termination condition comprises one or more selected from the following: minimization of the characteristic; maximization of the characteristic; reaching a certain number of iterations; reaching a value of the characteristic that crosses or matches a certain threshold value; reaching a certain computation time; or reaching a value of the characteristic within an acceptable error limit.

18. A computer program product comprising a non-transitory computer readable medium having instructions recorded thereon, the instructions when executed by a computer system implementing the method of any of clauses 1 to 17.

While the concepts disclosed herein may be used for a substrate such as a silicon wafer, it shall be understood that the disclosed concepts may be used with any type of measurement or lithographic systems, e.g., those used for measuring or patterning on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
computing, by a hardware computer system in accordance with one or more parameters of a substrate measurement recipe, measurement with a latent image of a target and measurement with a post-development image corresponding to the latent image, to evaluate a characteristic determined from the computed measurement with the latent image of the target and determined from the computed measurement with the post-development image corresponding to the latent image; and
adjusting the one or more parameters of the substrate measurement recipe and re-performing the computing, until a certain termination condition is satisfied with respect to the characteristic.

2. The method of claim 1, wherein the computing comprises computing a multi-variable cost function, the multi-variable cost function representing a metric characterizing a degree of similarity between the characteristic determined from the computed measurement with the latent image of the target and determined from the computed measurement with the post-development image corresponding to the latent image, the metric being a function of a plurality of design variables that comprise a parameter of the substrate measurement recipe, and the adjusting comprises adjusting one or more variables of the cost function.

3. The method of claim 1, wherein the characteristic is one or more selected from: overlay, alignment, focus, dose, a measurement signal, an accuracy parameter, a robustness parameter, and/or a detectability parameter.

4. The method of claim 1, wherein the computing comprises simulating the measurement with the latent image of the target and simulating the measurement with the post-development image corresponding to the latent image.

5. The method of claim 4, wherein the simulating comprises determining a characteristic of radiation used to measure the target from a parameter of the substrate measurement recipe.

6. The method of claim 4, wherein the simulating comprises determining an interaction between radiation and the target of the substrate measurement recipe from a parameter of the substrate measurement recipe.

7. The method of claim 1, wherein the latent image comprises a spatial distribution of a characteristic of resist in the resist layer before the resist layer is developed, and/or wherein the latent image comprises variations of thickness, refractive index, and/or extinction coefficient of exposed and unexposed portions of the resist layer.

8. The method of claim 1, wherein the substrate measurement recipe comprise a substrate measurement recipe for the latent image of the target and a substrate measurement recipe for the post-development image corresponding to the latent image and the substrate measurement recipe for the latent image of the target has a different measurement beam wavelength, different measurement polarization, and/or different measurement beam spatial or angular distribution, than the substrate measurement recipe for the post-development image corresponding to the latent image.

9. The method of claim 1, wherein the one or more parameters comprise a geometric or materials parameter of the target comprising the latent image, and/or wherein the one or more parameters comprise a parameter of measurement of the target comprising the latent image.

10. The method of claim 1, wherein the characteristic represents detectability of the target comprising the latent image, and/or wherein the characteristic represents stability of a measurement result of the target comprising the latent image, with respect to perturbation.

11. The method of claim 1, wherein the one or more parameters are under a constraint that detectability of the target comprising the latent image crosses or equals a threshold, and/or wherein the one or more parameters are under a constraint that stability of a measurement result of the target comprising the latent image with respect to perturbation crosses or equals a threshold.

12. The method of claim 1, wherein the target comprising the latent image further comprises a structure under the resist layer.

13. The method of claim 1, wherein the termination condition comprises one or more selected from the following: minimization of the characteristic; maximization of the characteristic; reaching a certain number of iterations; reaching a value of the characteristic that crosses or matches a certain threshold value; reaching a certain computation time; or reaching a value of the characteristic within an acceptable error limit.

14. A computer program product comprising a non-transitory computer readable medium having instructions recorded therein, the instructions, upon execution by a computer system, configured to cause the computer system to at least:

compute, in accordance with one or more parameters of a substrate measurement recipe, measurement with a latent image of a target and measurement with a post-development image corresponding to the latent image, to evaluate a characteristic determined from the computed measurement with the latent image of the target and determined from the computed measurement with the post-development image corresponding to the latent image; and adjust the one or more parameters of the substrate measurement recipe and re-perform the computing, until a certain termination condition is satisfied with respect to the characteristic.

15. The computer program product of claim 14, wherein the computation comprises computation of a multi-variable cost function, the multi-variable cost function representing a metric characterizing a degree of similarity between the characteristic determined from the computed measurement with the latent image of the target and determined from the computed measurement with the post-development image corresponding to the latent image, the metric being a function of a plurality of design variables that comprise a parameter of the substrate measurement recipe, and the adjustment comprises adjustment of one or more variables of the cost function.

16. The computer program product of claim 14, wherein the characteristic is one or more selected from: overlay, alignment, focus, dose, a measurement signal, an accuracy parameter, a robustness parameter, and/or a detectability parameter.

17. The computer program product of claim 14, wherein the computation comprises simulation of the measurement with the latent image of the target and simulation of the measurement with the post-development image corresponding to the latent image.

18. The computer program product of claim 14, wherein the latent image comprises a spatial distribution of a characteristic of resist in the resist layer before the resist layer is developed, and/or wherein the latent image comprises variations of thickness, refractive index, and/or extinction coefficient of exposed and unexposed portions of the resist layer.

19. The computer program product of claim 14, wherein the substrate measurement recipe comprise a substrate measurement recipe for the latent image of the target and a substrate measurement recipe for the post-development image corresponding to the latent image and wherein the substrate measurement recipe for the latent image of the target has a different measurement beam wavelength, different measurement polarization, and/or different measurement beam spatial or angular distribution, than the substrate measurement recipe for the post-development image corresponding to the latent image.

20. The computer program product of claim 14, wherein the one or more parameters comprise a geometric or materials parameter of the target comprising the latent image, and/or wherein the one or more parameters comprise a parameter of measurement of the target comprising the latent image.

* * * * *